(12) United States Patent
Wu et al.

(10) Patent No.: US 10,164,074 B2
(45) Date of Patent: Dec. 25, 2018

(54) SEMICONDUCTOR DEVICE WITH GATE ELECTRODE EMBEDDED IN SUBSTRATE

(71) Applicant: TAIWAN SEMICONDUCTOR MANUFACTURING CO., LTD., Hsinchu (TW)

(72) Inventors: Wei-Cheng Wu, Hsinchu County (TW); Li-Feng Teng, Hsinchu (TW); Alexander Kalnitsky, San Francisco, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/600,876

(22) Filed: May 22, 2017

(65) Prior Publication Data

US 2018/0151580 A1  May 31, 2018

Related U.S. Application Data

(60) Provisional application No. 62/426,336, filed on Nov. 25, 2016.

(51) Int. Cl.
| | |
|---|---|
| *H01L 29/423* | (2006.01) |
| *H01L 29/66* | (2006.01) |
| *H01L 29/08* | (2006.01) |
| *H01L 29/06* | (2006.01) |
| *H01L 21/762* | (2006.01) |
| *H01L 21/28* | (2006.01) |

(Continued)

(52) U.S. Cl.
CPC .. *H01L 29/66825* (2013.01); *H01L 21/28026* (2013.01); *H01L 21/76224* (2013.01); *H01L 27/11517* (2013.01); *H01L 27/11524* (2013.01); *H01L 27/11531* (2013.01); *H01L 27/11548* (2013.01); *H01L 29/0649* (2013.01); *H01L 29/0847* (2013.01); *H01L 29/4236* (2013.01); *H01L 29/42376* (2013.01); *H01L 29/66613* (2013.01); *H01L 29/66621* (2013.01); *H01L 21/28273* (2013.01)

(58) Field of Classification Search
CPC ......... H01L 21/28026; H01L 21/28273; H01L 21/76224; H01L 27/11517; H01L 27/11524; H01L 29/0649; H01L 29/0653; H01L 29/0847; H01L 29/4236; H01L 29/42376; H01L 29/66613; H01L 29/66621; H01L 29/66825; H01L 29/788
See application file for complete search history.

(56) References Cited

U.S. PATENT DOCUMENTS

| | | | |
|---|---|---|---|
| 7,795,094 B2 * | 9/2010 | Kreipl | H01L 27/112 257/E21.592 |
| 9,837,540 B2 * | 12/2017 | Liou | H01L 29/7851 |

(Continued)

*Primary Examiner* — Stephen W Smoot
(74) *Attorney, Agent, or Firm* — McClure, Qualey & Rodack, LLP

(57) ABSTRACT

A semiconductor device includes a semiconductor substrate, a gate dielectric layer, a gate electrode and source and drain regions. The gate dielectric layer extends into a first trench in the semiconductor substrate. The gate electrode is over the gate dielectric layer and is at least partially embedded in the first trench in the semiconductor substrate. The source and drain regions are in the semiconductor substrate and proximate the first trench in the semiconductor substrate.

20 Claims, 32 Drawing Sheets

(51) Int. Cl.
*H01L 27/11524* (2017.01)
*H01L 27/11517* (2017.01)
*H01L 27/11531* (2017.01)
*H01L 27/11548* (2017.01)

(56) References Cited

U.S. PATENT DOCUMENTS

| | | | |
|---|---|---|---|
| 2006/0023558 A1* | 2/2006 | Cho | G11C 16/0483 365/230.06 |
| 2008/0121990 A1* | 5/2008 | Hasunuma | H01L 27/10876 257/333 |
| 2009/0065809 A1* | 3/2009 | Yamakawa | H01L 21/82380 257/190 |
| 2015/0263010 A1* | 9/2015 | Chuang | H01L 29/66545 257/319 |

* cited by examiner

SEMICONDUCTOR DEVICE WITH GATE ELECTRODE EMBEDDED IN SUBSTRATE

PRIORITY CLAIM AND CROSS-REFERENCE

This application claims priority to U.S. Provisional Application Ser. No. 62/426,336, filed Nov. 25, 2016, which is herein incorporated by reference.

BACKGROUND

A trend in the semiconductor manufacturing industry is to integrate different semiconductor components of a composite semiconductor device into a common semiconductor structure. Such integration advantageously allows lower manufacturing costs, simplified manufacturing procedures, and increased operational speed. One type of composite semiconductor device is an embedded flash memory device. An embedded flash memory device includes an array of flash memory cells and other semiconductor devices supporting operation of the flash memory cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
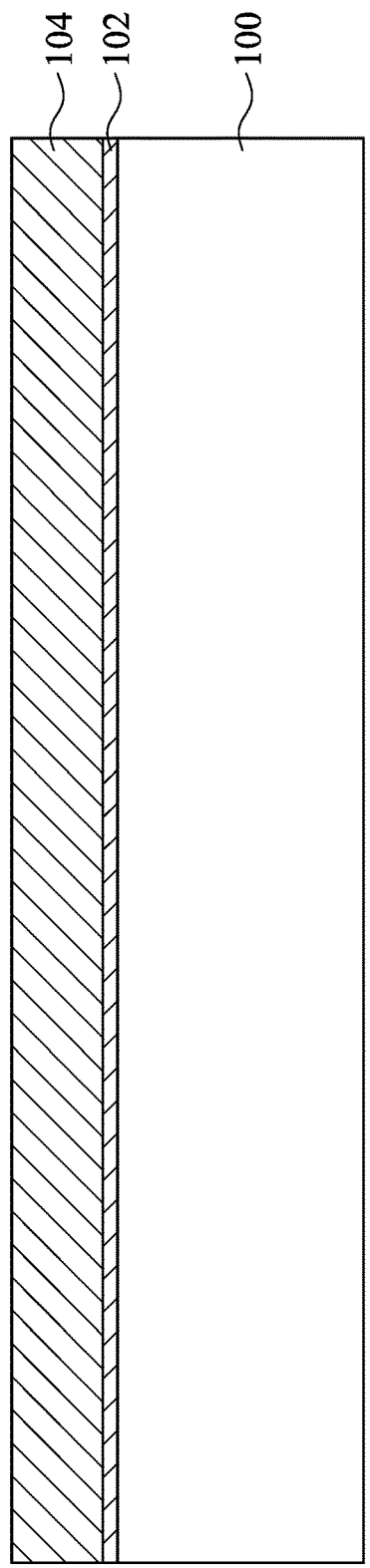
FIGS. 1-31 are cross-sectional views of intermediate stages in manufacture of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-31 are cross-sectional views of intermediate stages in manufacture of a semiconductor device in accordance with some embodiments of the present disclosure. As shown in FIG. 1, an oxide layer 102 is formed over a semiconductor substrate 100. The semiconductor substrate 100 may be formed of silicon, germanium, III-V compound semiconductor, or other applicable semiconductor materials. Formation of the oxide layer 102 may include thermal oxidation or deposition, such as chemical vapor deposition (CVD) or physical vapor deposition (PVD). Nitride layer 104, such as silicon nitride, is formed over the oxide layer 102 using suitable techniques, such as CVD or PVD.

Figure 2:
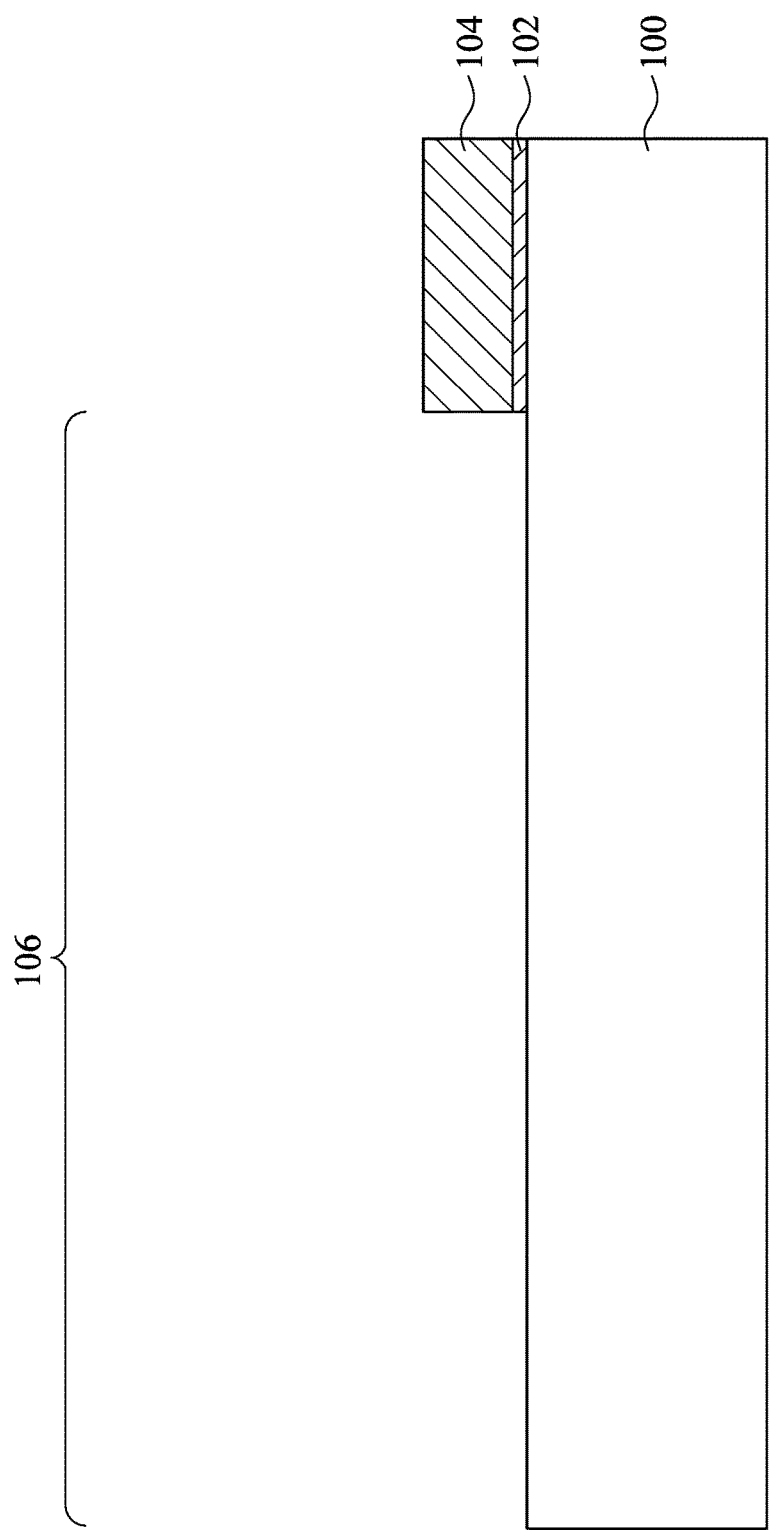

Reference is made to FIG. 2. The oxide layer 102 and the nitride layer 104 are patterned to expose a defined region 106 of the semiconductor substrate 100. The defined region 106 includes memory and high voltage (HV) device regions in some embodiments. The oxide layer 102 and nitride layer 104 are patterned using a lithography process. For example, a layer of photoresist material is deposited over the nitride layer 104. The layer of photoresist material is irradiated (exposed) in accordance with a predetermined pattern and developed to remove portions of the photoresist material, so as to expose portion of the nitride layer 104. The exposed portion of the nitride layer 104 and underlying portions of oxide layer 102 are removed to expose the defined region 106 of the semiconductor substrate 100.

Figure 3:
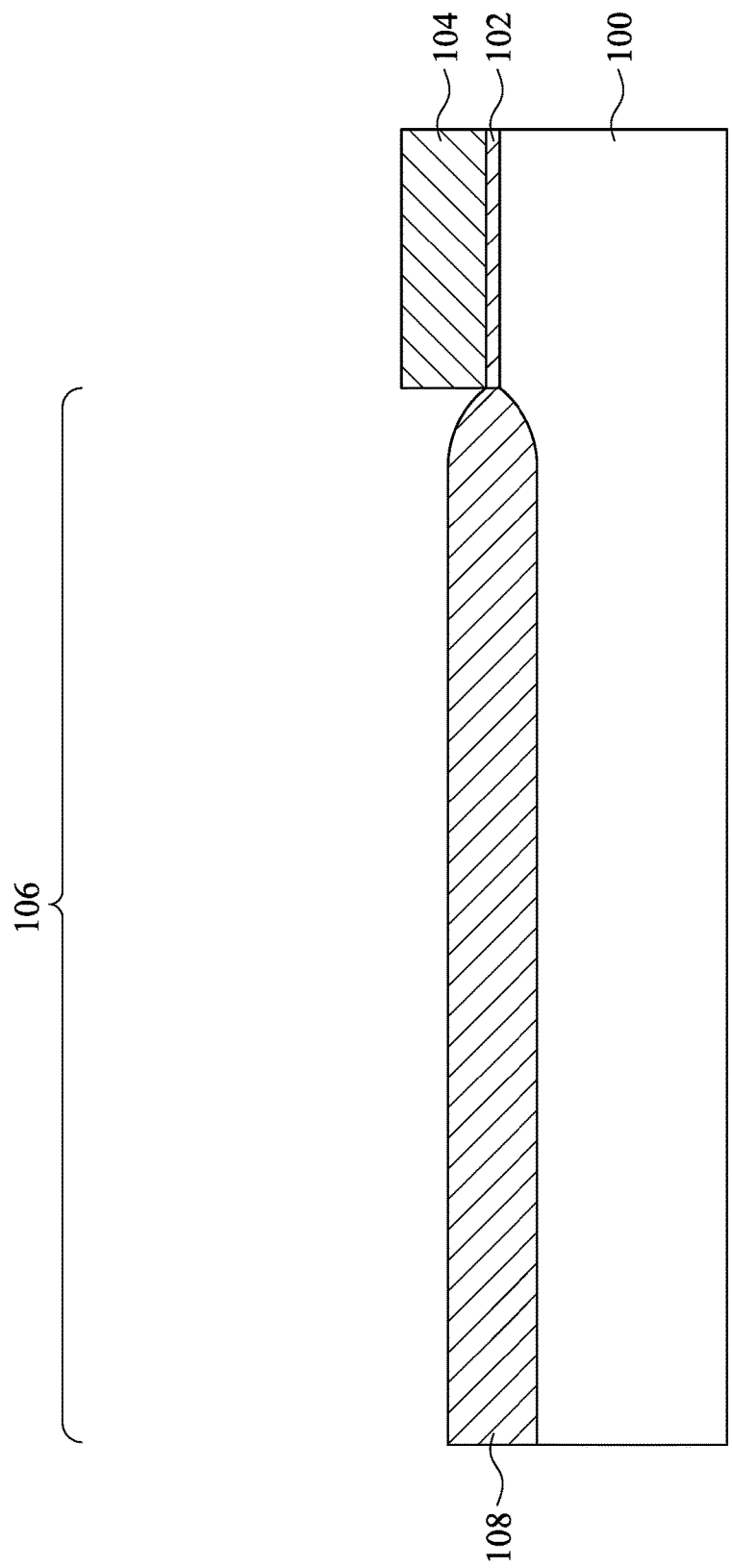
Figure 4:
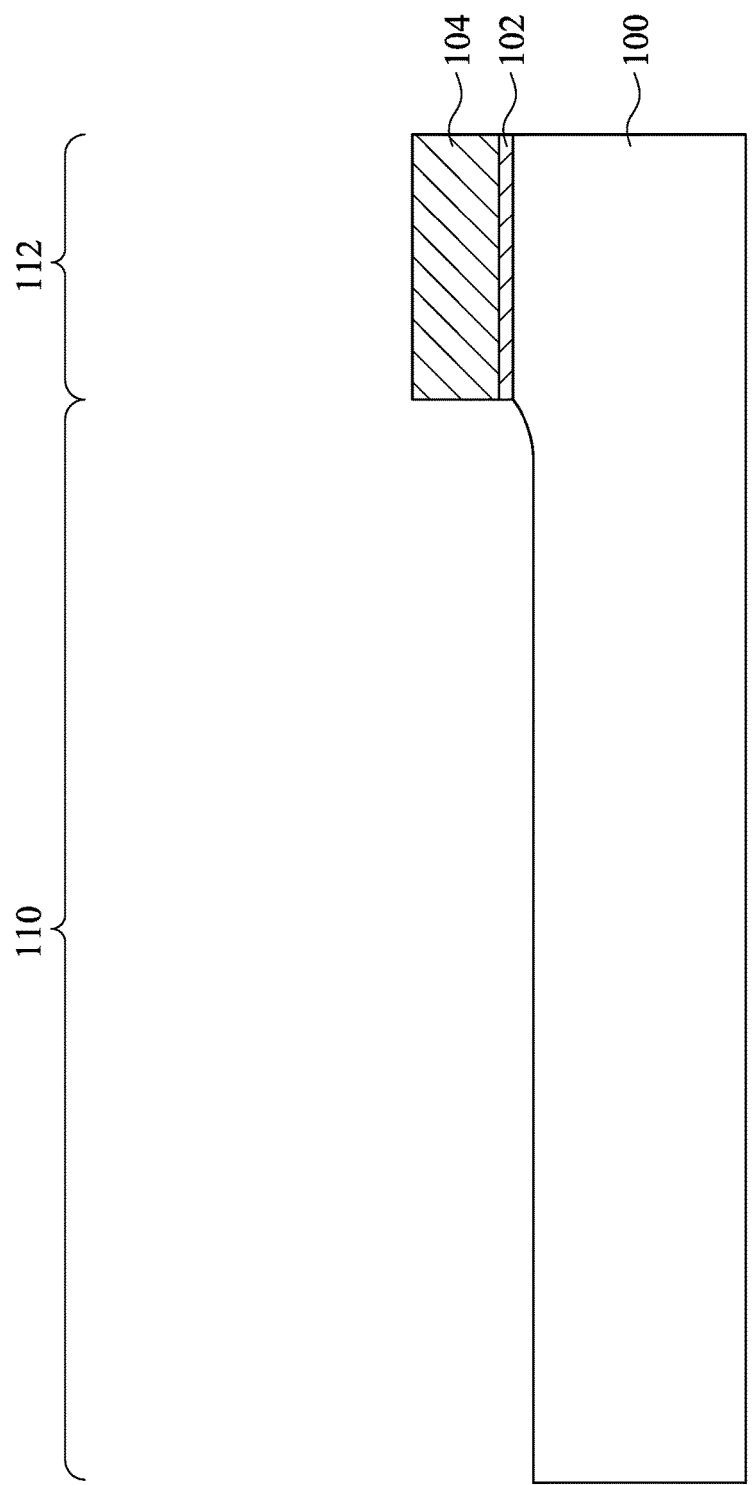

After the defined region 106 is exposed, oxide 108 can be grown over the semiconductor substrate 100 in the defined region 106, and the resulting structure is shown in FIG. 3. In some embodiments, the oxide 108 can be grown by wet oxidation, and hence an exposed uppermost portion of the semiconductor substrate 100 can be oxidized to form the oxide 108. Thereafter, as shown in FIG. 4, the oxide 108 can be removed from the semiconductor substrate 100, thereby creating a recessed region 110 over the semiconductor substrate 100. In some embodiments, the oxide 108 is removed by wet etching or by a combination of wet etching and dry etching. In some embodiments, an oxide thickness ranging from about 400 Angstroms to about 1000 Angstroms is removed to create a recess depth ranging from about 150 Angstroms to about 800 Angstroms. It is understood that chemical mechanical polish (CMP) in later gate replacement process for high-k metal gate (HKMG) device over non-recessed region 112 may damage gates of memory and HV devices or reduce gate heights of memory and HV devices. This recession may be advantageous to mitigate the gate damage or gate height loss of memory and HV devices when they are formed over the recessed region 110.

Figure 5:
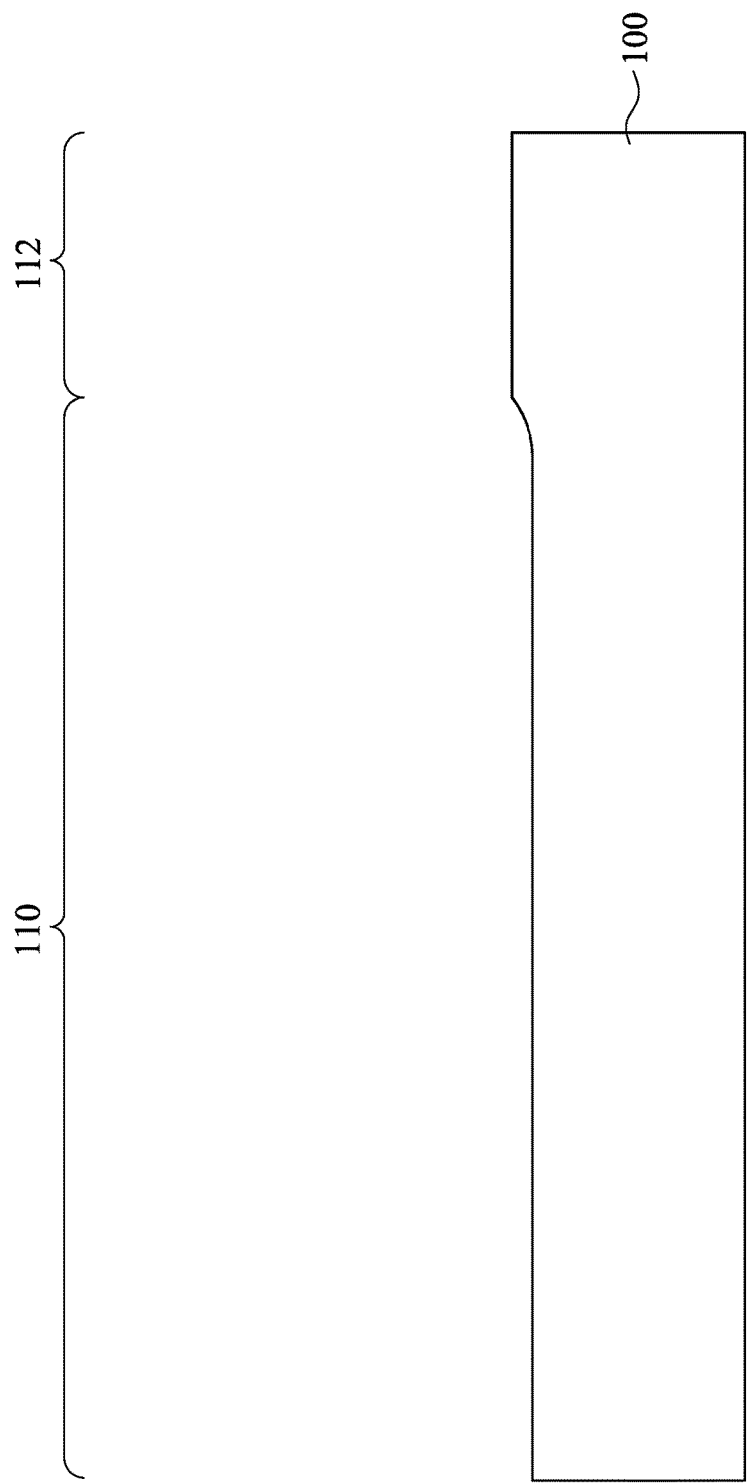
Figure 6:
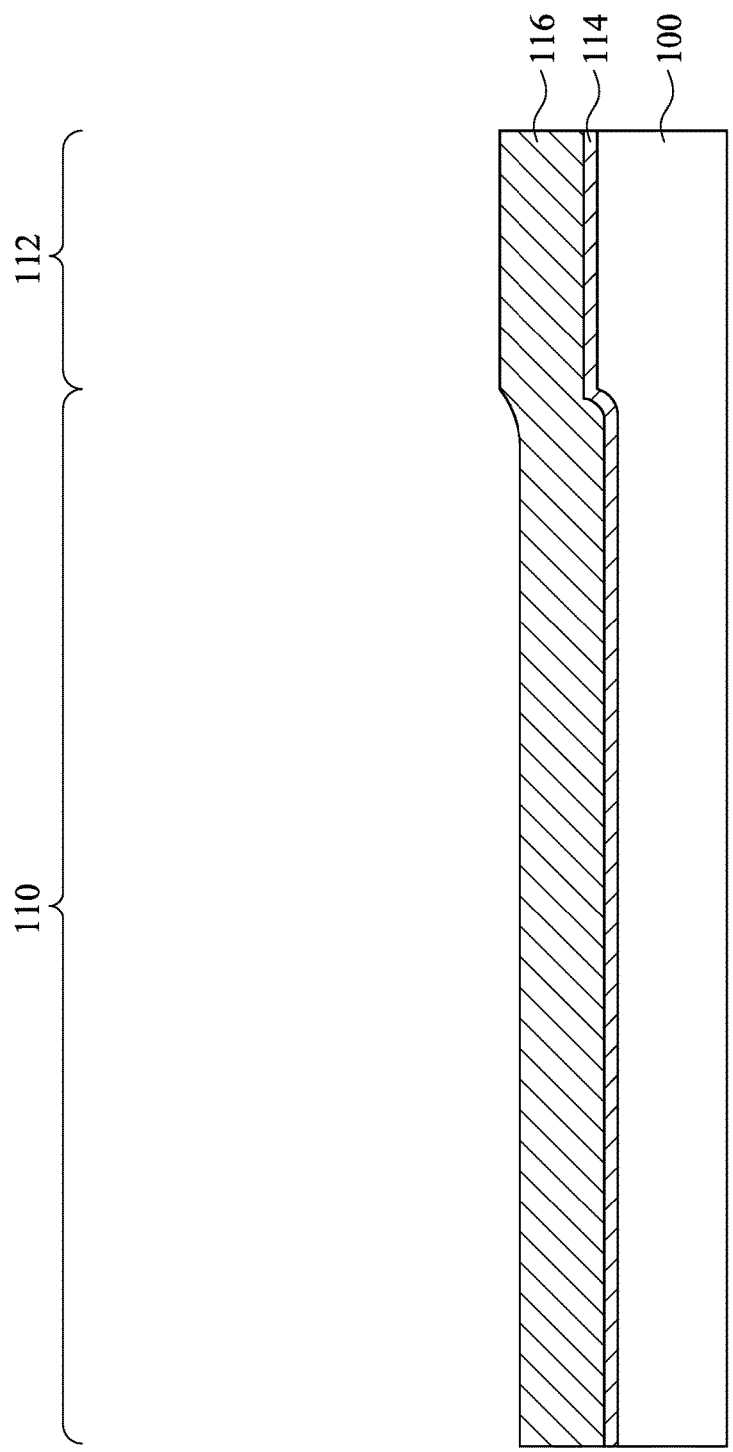

Reference is made to FIG. 5. The remaining oxide layer 102 and nitride layer 104 are removed from the semiconductor substrate 100, so that the non-recessed region 112 is exposed. Afterwards, as shown in FIG. 6, a pad layer 114 is formed over recessed and non-recessed regions 110 and 112 of the semiconductor substrate 100, followed by the deposition of a mask layer 116. The pad layer 114 is blanket formed on the semiconductor substrate 100, and it may be a thin film comprising silicon oxide formed, for example, using a thermal oxidation process, a deposition process, such as CVD or other suitable processes. The mask layer 116 may be blanket formed on the pad layer 114. The pad layer 114 may act as an adhesion layer between semiconductor substrate 100 and mask layer 116. The pad layer 114 may also act as an etch stop layer for etching mask layer 116. In some embodiments, the mask layer 116 is formed of silicon nitride, for example, using low-pressure chemical vapor deposition (LPCVD). In other embodiments, the mask layer 116 is formed by plasma enhanced chemical vapor deposition (PECVD), or plasma anodic nitridation. The mask layer 116 is used as a hard mask during subsequent photolithography processes. For example, the mask layer 116 may be used to protect the semiconductor substrate 100 from fabrication operations involved in the etching of trenches in the semiconductor substrate 100 and subsequent chemical mechanical polishing (CMP) planarization operations.

Figure 7:
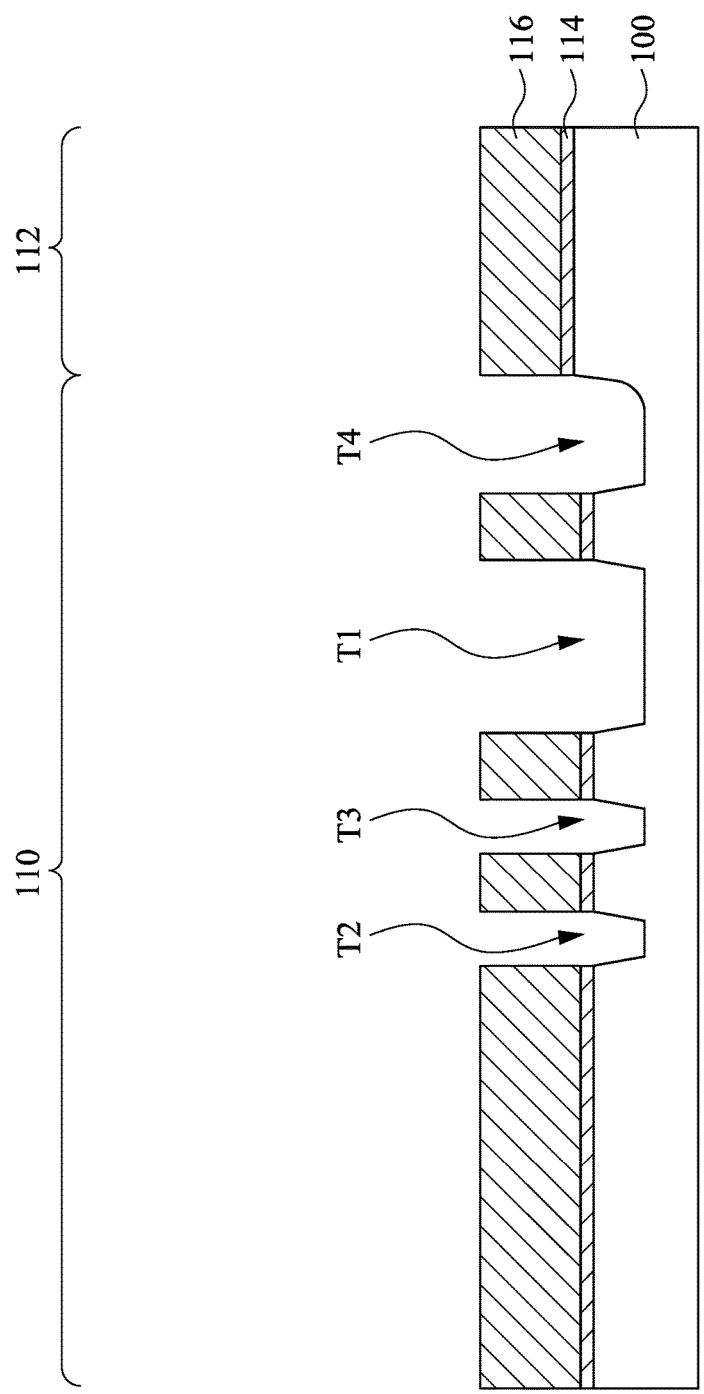

Reference is made to FIG. 7. Shallow trenches T1, T2, T3 and T4 are etched into the semiconductor substrate 100. The shallow trenches T1-T3 are formed in the recessed region 110 of the semiconductor substrate 100. The shallow trench T4 is formed in a transition region between the recessed and non-recessed regions 110 and 112, and hence the shallow trench T4 has a different geometry from shallow trenches T1-T3. For example, shallow trenches T1-T3 may be substantially symmetrical along a vertical axis or a y-axis whereas the shallow trench T4 is asymmetrical along y-axis. In some embodiments, the shallow trench T1 has a different geometry from other trenches, and such geometry may facilitate forming gate structure for HV device in the shallow trench T1. For example, the shallow trench T1 may be wider than other shallow trenches, such as trenches T2-T4. This width difference may be advantageous to either form suitable gate structure for HV device in the shallow trench T1 or form suitable isolation dielectrics in shallow trenches T2-T4.

The Etching of shallow trenches T1-T4 may be performed using any of a variety of substrate etching techniques, such as plasma etching at a variety of pressures, temperatures, and so forth. The etching technique may also etch through the mask layer 116 and the pad layer 114. In some embodiments, bottom surface of the shallow trench T1 may be substantially level with that of other trenches, such as shallow trenches T2-T4. Photolithography techniques may be used to define positions and widths of the shallow trenches T1-T4. For example, above the mask layer 116 may be a photoresist mask, and it can be patterned, with openings in the photoresist mask corresponding to locations of trenches to be created. For example, a layer of photoresist material is deposited over the mask layer 116. The layer of photoresist material is irradiated (exposed) in accordance with a predetermined pattern and developed to remove portions of the photoresist material, so as to form openings to exposed portions of the mask layer 116. The exposed portions of the mask layer 116 and underlying portions of pad layer 114 and semiconductor substrate 100 are removed to form shallow trenches T1-T4 using suitable etching operations. The remaining photoresist material protects the underlying material from etching the shallow trenches T1-T4. After etching the shallow trenches T1-T4, the remaining photoresist material can be removed using, for example, an ashing process.

Figure 8:
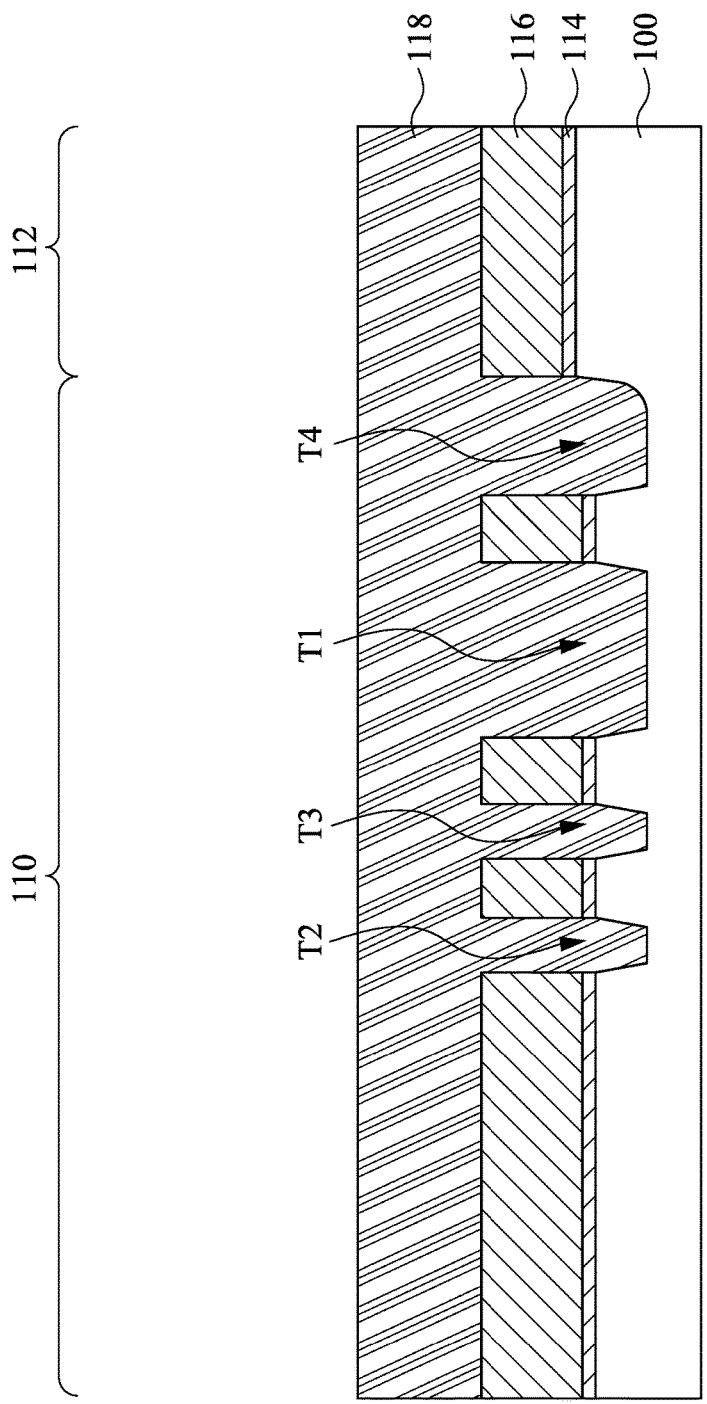

Next, as shown in FIG. 8, isolation dielectric 118 is then formed on the semiconductor substrate 100 and overfills the shallow trenches T1-T4. The isolation dielectric 118 includes a material such as silicon oxide, silicon nitride, silicon oxynitride, low-k materials, other suitable materials, or any combinations thereof. In some embodiments where the isolation dielectric 118 includes silicon oxide, the silicon oxide can be formed by CVD, atomic layer deposition (ALD), high density plasma CVD (HDPCVD), other suitable methods, or combinations thereof. The silicon oxide may be alternatively formed by a high aspect ratio process (HARP). In some embodiments, an optional thermal oxide trench liner is grown to improve the trench interface. The CVD process for depositing the isolation dielectric 118, for example, can use chemicals including Hexachlorodisilane (HCD or $Si_2Cl_6$), Dichlorosilane (DCS or $SiH_2Cl_2$), Bis (TertiaryButylAmino)Silane (BTBAS or $C_8H_{22}N_2Si$) and Disilane (DS or $Si_2H_6$). In some embodiments, the isolation dielectric 118 can have a multi-layer structure, for example, a thermal oxide liner layer with silicon nitride formed over the liner. Thereafter, a thermal annealing will be performed to the isolation dielectric 118.

Figure 9:
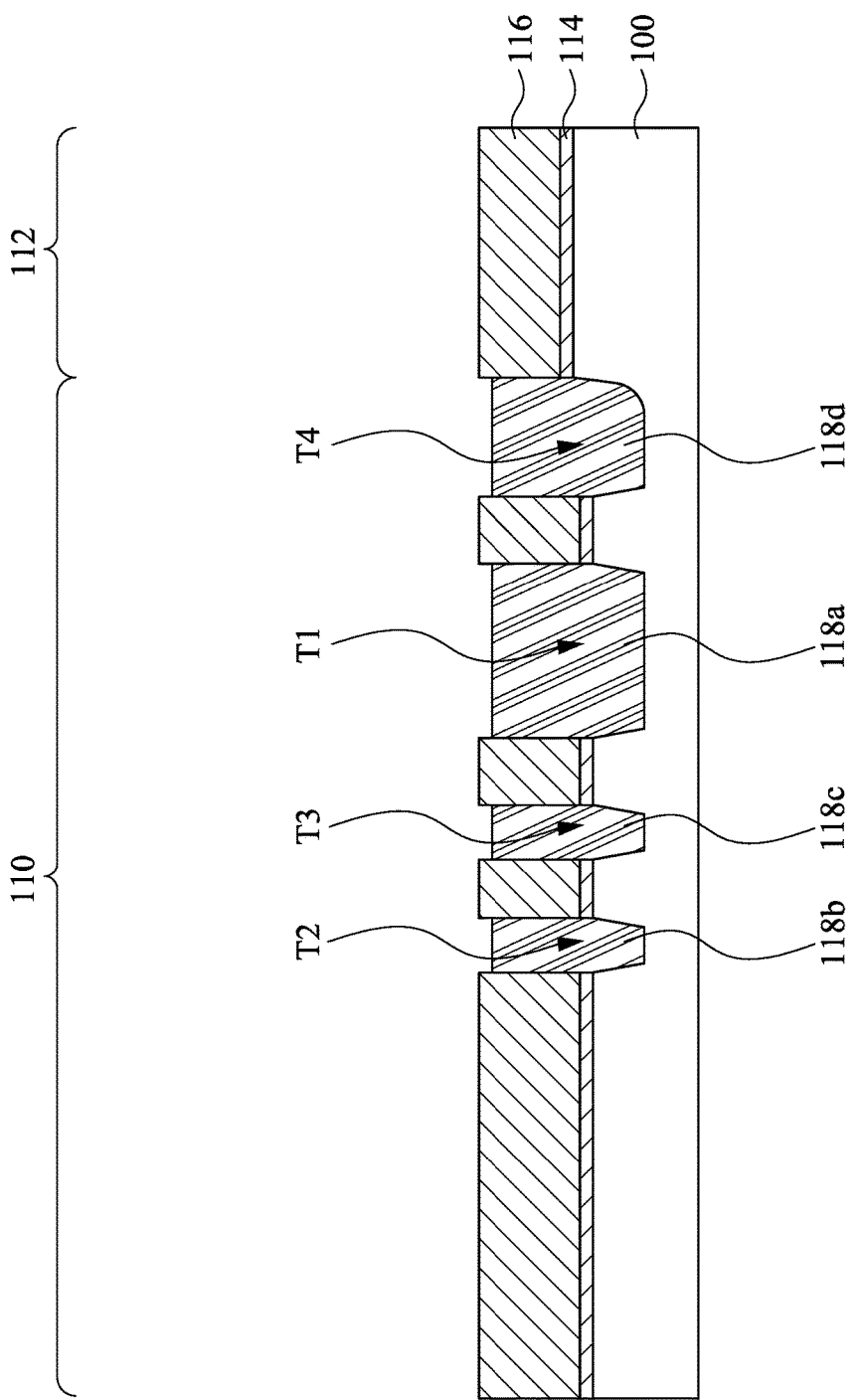

Thereafter, as shown in FIG. 9, a planarization process, such as a CMP process is performed to remove excess isolation dielectric 118 outside the shallow trenches T1-T4. After the planarization, portions of the isolation dielectric 118 filling the shallow trenches T1, T2, T3 and T4 can be referred to shallow trench isolations (STIs) 118a, 118b, 118c and 118d, respectively. The STIs 118a-118d may be optionally recessed through an etching process, such that top surfaces of STIs 118a-118d are lower than that of the mask layer 116. In some embodiments, recessing of the STIs 118a-118d may include a wet etching process, for example, by dipping the semiconductor substrate 100 in hydrofluoric acid (HF). In alternative embodiments, the etching process may be a dry etching process, for example, the dry etching process may be performed using $CHF_3$ or $BF_3$ as etching gases.

Figure 10:
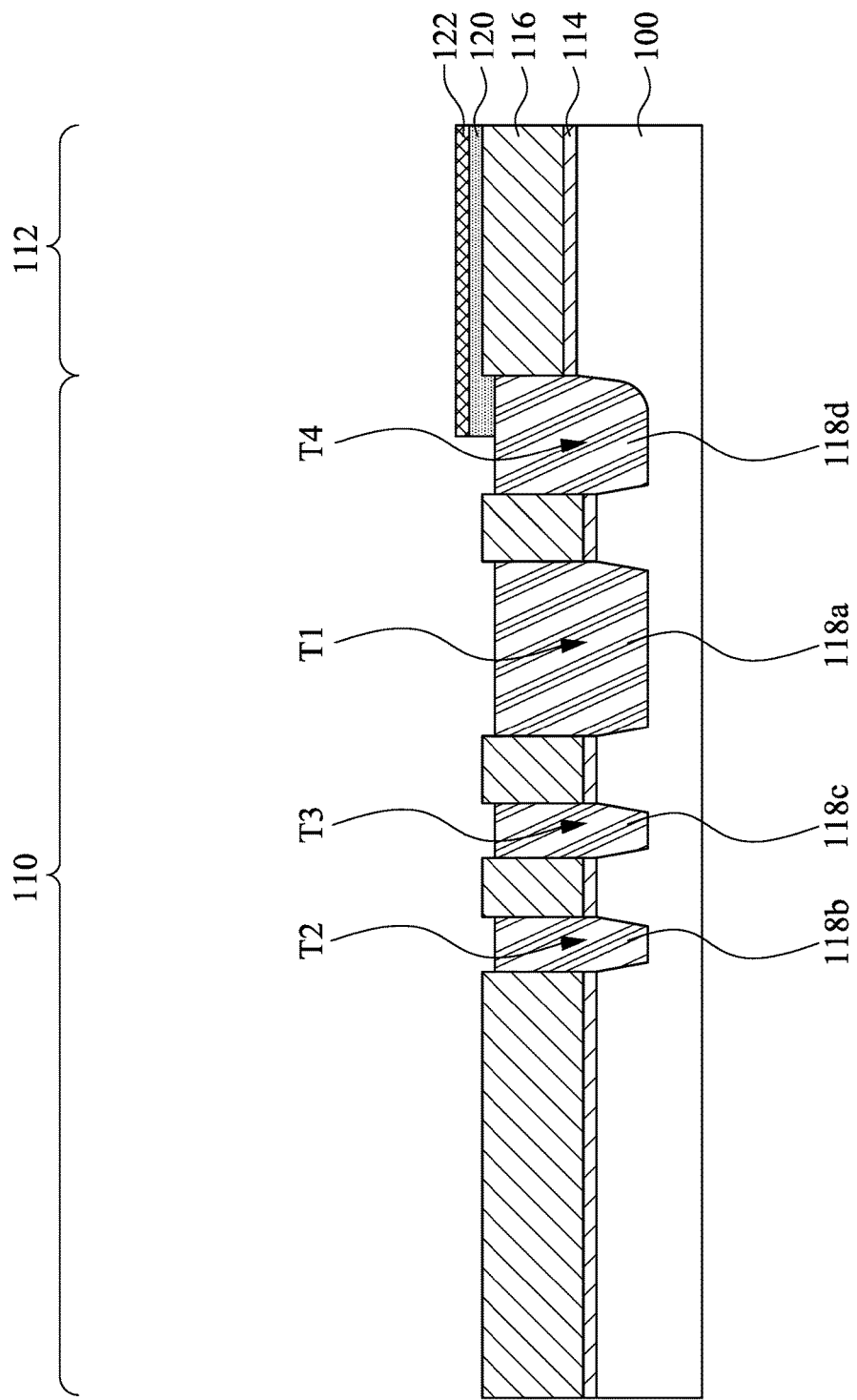

Reference is made to FIG. 10. First mask 120 is formed over at least the non-recessed region 112, while exposing a majority of the recessed region 110. Second mask 122 is then formed over the first mask 120. First and second masks 120 and 122 may have different materials to protect underlying material from different etching processes subsequently performed to the majority of the recessed region 110. In some embodiments, the first mask 120 may include silicon nitride, and the second mask 122 may include oxide. Formation of the first and second masks 120 and 122 may include deposition and patterning techniques, as examples.

Figure 11:
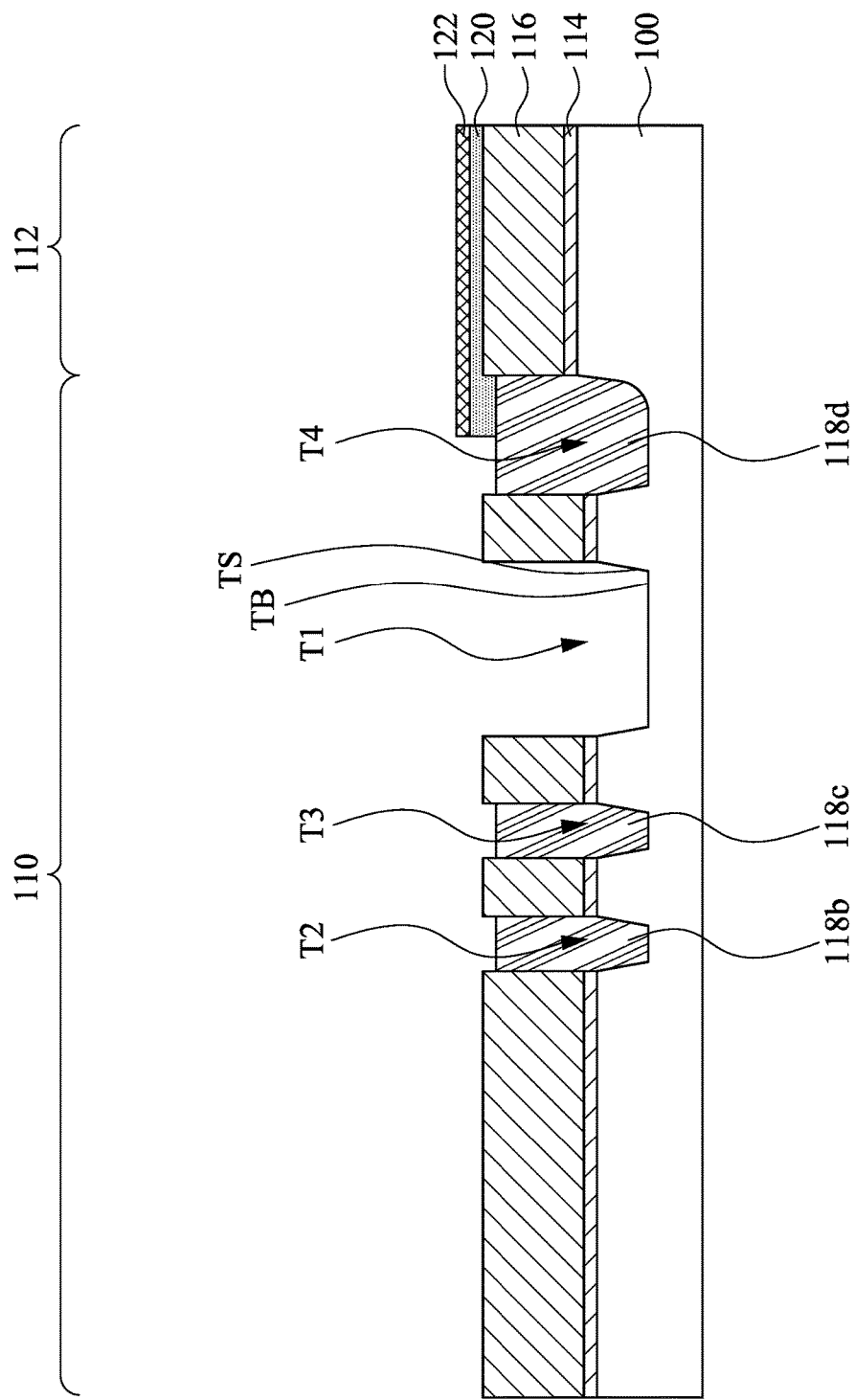

Reference is made to FIG. 11. The STI 118a in the shallow trench T1 is removed to expose trench bottom surface TB and trench sidewalls TS of the shallow trench T1. Stated differently, surfaces of the semiconductor substrate 100 defining the shallow trench T1 are exposed after removal of the STI 118a. Removal of the STI 118a may include a dry etching process, a wet etching process, or combinations thereof. For example, a majority of the STI 118a can be removed using a dry etching process, while leaving some residues of the STI 118a on trench sidewalls TS of the shallow trench T1, and then, the dielectric residues on trench sidewalls TS can be removed using a wet etching process. In some embodiments, exemplary dry etching for removing the majority of STI 118a can be performed using $CHF_3$ or $BF_3$ or other suitable gases as etching gases. In some embodiments, exemplary wet etching for removing residues of STI 118a on trench sidewalls TS can be performed using hydrofluoric acid (HF) or other suitable solution as etchant. During the removal of STI 118a, other regions of the semiconductor substrate 100 can be masked. More particularly, other STIs in the semiconductor substrate 100, such as STIs 118b-118d, are masked during the removal of STI 118a, and these masked STIs can thus be protected from the etching process performed to STI 118a.

Figure 12:
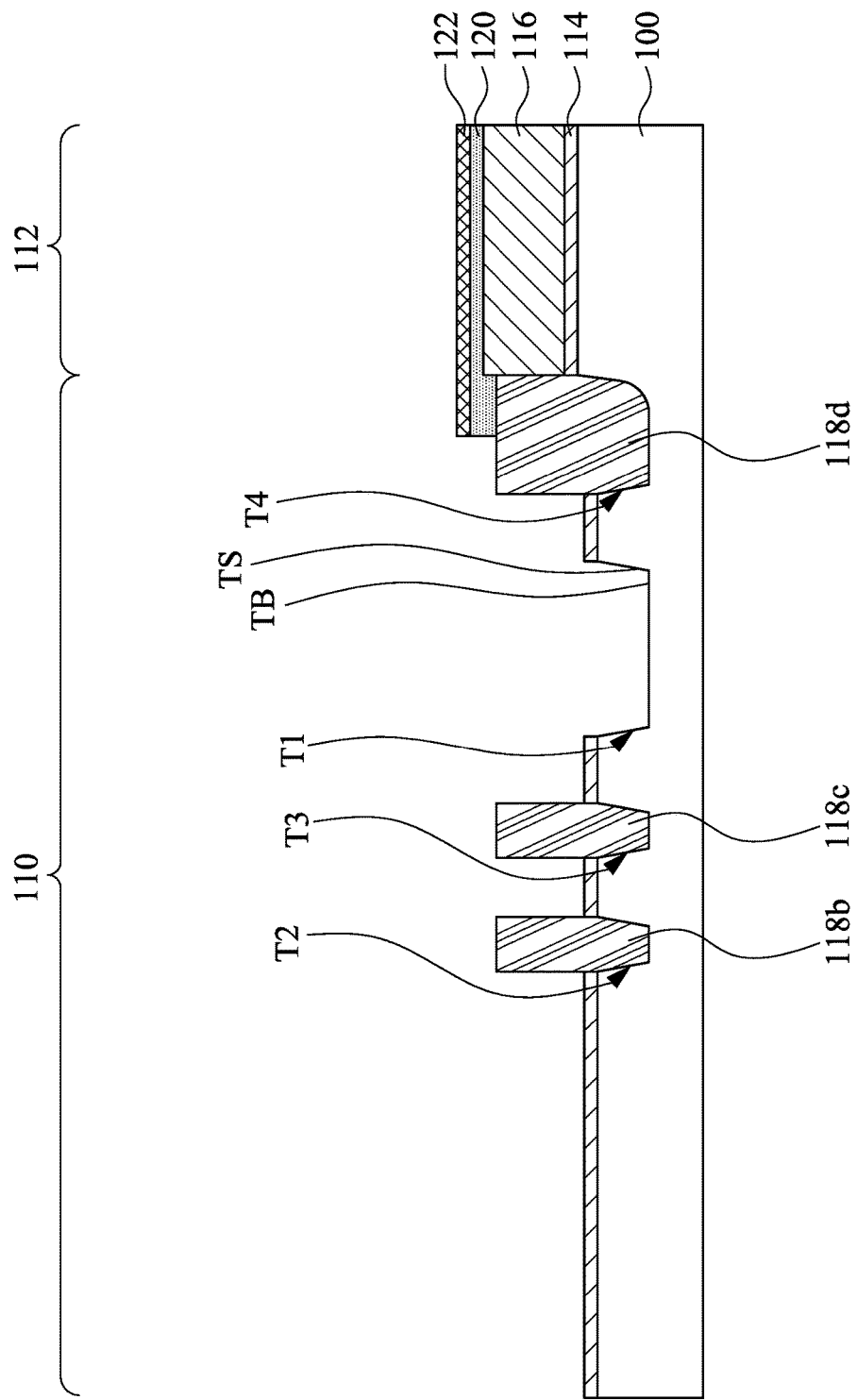

Reference is made to FIG. 12. Portions of the mask layer 116 unmasked by the mask 122 are removed to expose their underlying portions of pad layer 114. In other words, portions of the mask layer 116 over the recessed region 110 are removed. The mask layer 116, if formed of silicon nitride, may be removed by a wet process using etchant such as hot H₃PO₄. The pad layer 114 and STIs 118b-118d are made of materials different from that of the mask layer 116. The pad layer 114 and the STIs 118b-118d have higher etch resistance to the etchant used to remove the mask layer 116. In other words, the pad layer 114 remains atop the recessed region 110 of the semiconductor substrate 100 and thus acts as an etch stop layer for removing the mask layer 116.

Figure 13:
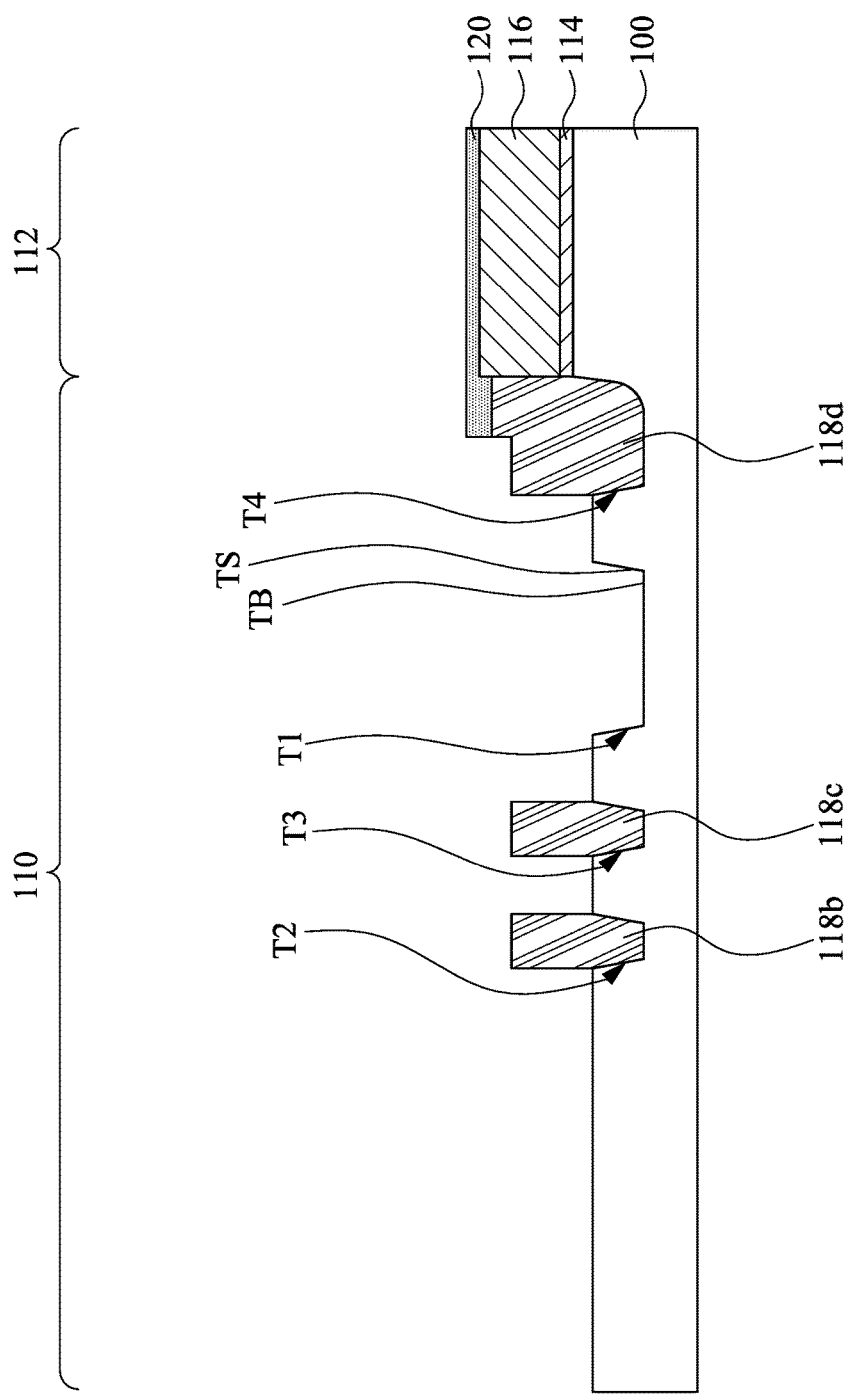

Reference is made to FIG. 13. Portions of the pad layer 114 unmasked by the mask 120 are removed to expose their underlying portions of semiconductor substrate 100. In other words, portions of the pad layer 114 over the recessed region 110 are removed. The pad layer 114, if formed of oxide, may be removed by a wet process using etchant such as diluted HF. Exposed top portions of the STIs 118b, 118c and 118d unmasked by the mask 120 may be removed as well, in some embodiments.

Figure 14:
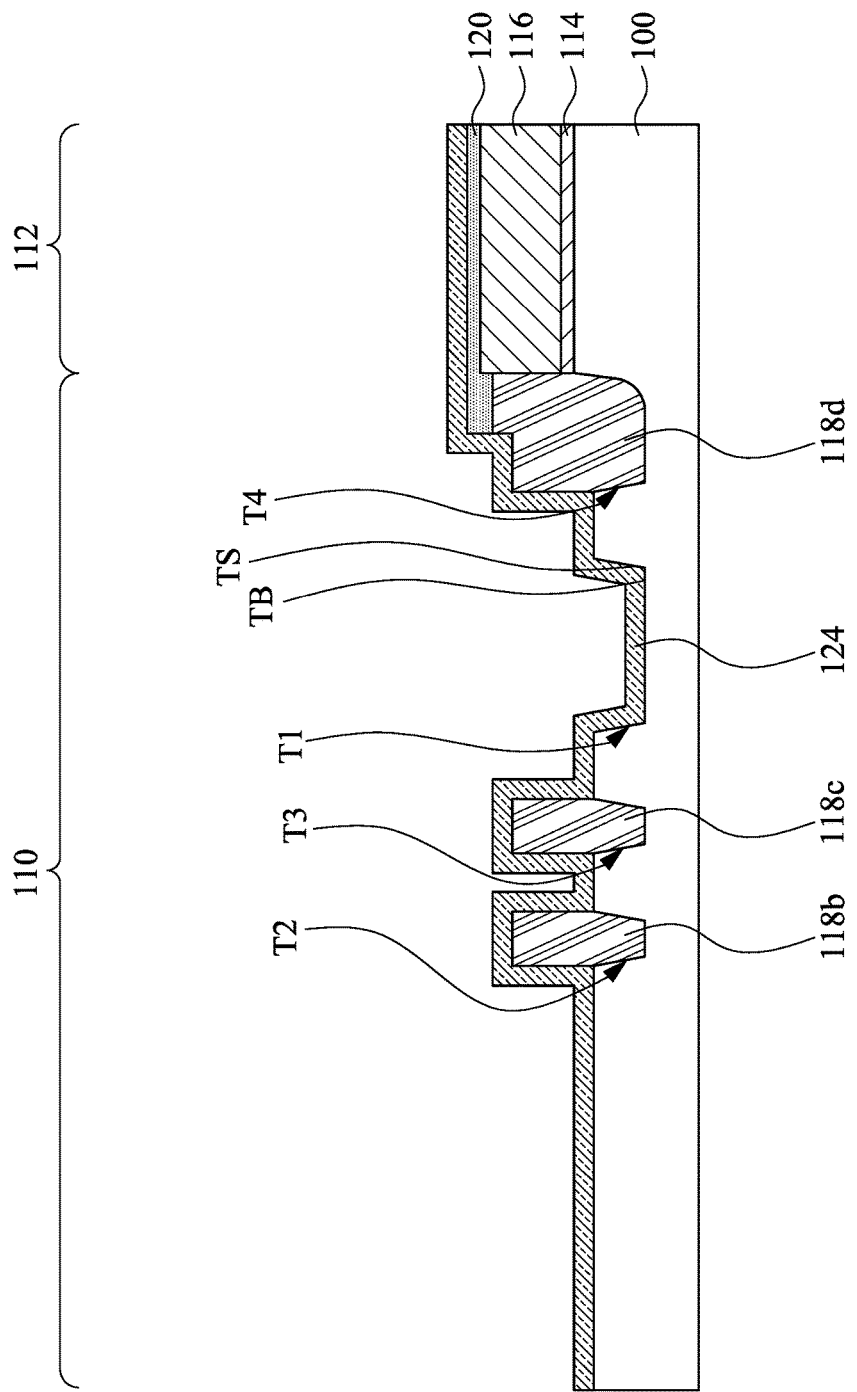
Figure 15:
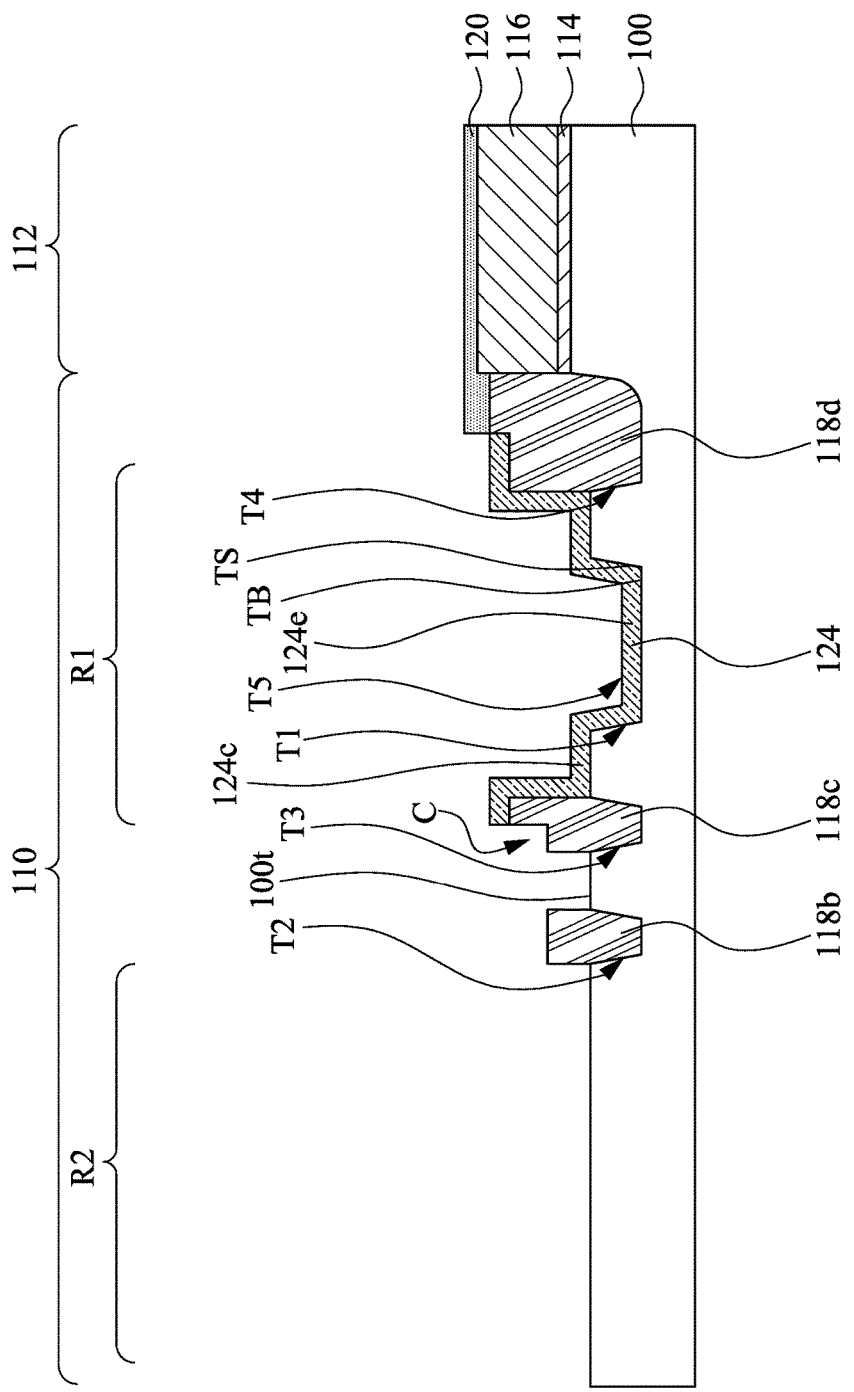

Reference is made to FIG. 14. A HV gate dielectric layer 124 is blanket formed over the substrate 100. Afterwards, the HV gate dielectric layer 124 is patterned using suitable photolithography and etching, while leaving a portion of the HV gate dielectric layer 124 over a predetermined HV region R1 of the semiconductor substrate 100, and the resulting structure is shown in FIG. 15. A portion of the remaining HV gate dielectric layer 124 over the HV region R1 is conformal in the shallow trench T1. Therefore, trench bottom surface TB and trench sidewalls TS of the shallow trench T1 are covered by the HV gate dielectric layer 124. Stated differently, the HV gate dielectric layer 124 extends into the shallow trench T1. Alternatively stated, the HV gate dielectric layer 124 can act as a dielectric trench liner lining the trench bottom surface TB and trench sidewalls TS of the shallow trench T1. The HV gate dielectric layer 124 defines trench T5 due to the fact that the HV gate dielectric layer 124 is conformally formed in the shallow trench T1. As such, the trench T5 may have shape similar to or substantially the same as that of the trench T1. For example, the trench T1 may taper in a direction toward the semiconductor substrate 100, and the trench T5 may taper in the same direction as well. That is, the trench T5 defined by the HV gate dielectric layer 124 tapers in direction toward the semiconductor substrate 100 in some embodiments.

In some embodiments, the predetermined HV region R1 is wider than the shallow trench T1. Therefore, the HV gate dielectric layer 124 includes a cap portion 124c outside the shallow trench T1 and an embedded portion 124e embedded in the shallow trench T1. The cap portion 124c caps recessed top surface 100t of the semiconductor substrate 100. The embedded portion 124e has a rectangular cup shape, and the cap portion 124c extends from top of the embedded portion 124e outwardly. Recessed top surface 100t of the semiconductor substrate 100 coincides with trench sidewall TS of the shallow trench T1, and the HV gate dielectric layer 124 may conformally cover the recessed top surface 100t and the trench sidewall TS. In other words, the cap portion 124c may be conformal to the recessed top surface 100t, and the embedded portion 124e may be conformal to a profile of the shallow trench T1.

In some embodiments, thickness of the HV gate dielectric layer 124 may be between from about 50 Angstroms and about 1000 Angstroms. In accordance with some embodiments, HV gate dielectric layer 124 may be formed using thermal oxidation by oxidizing the semiconductor substrate 100, followed by patterning the oxidation layer. In alternative embodiments, HV gate dielectric layer 124 is formed using CVD method such as PECVD, low pressure CVD (LPCVD), ALD, or the like, and after the CVD process, the HV gate dielectric layer 124 is patterned. In these embodiments, HV gate dielectric layer 124 may include silicon oxide, silicon oxynitride, or the like. The dielectric constant of the HV gate dielectric layer 124 may be between about 3.5 and about 4.0 in some embodiments.

In some embodiments, the patterning of the HV gate dielectric layer 124 may remove upper portions of the STIs 118b and 118c outside the predetermined HV region R1. Since a portion of the STI 118c (e.g. right portion of the STI 118c in FIG. 15) is located within the predetermined HV region R1, and a portion of the STI 118c (e.g. left portion of the STI 118c) is located outside the predetermined HV region R1, a notched corner C may be formed in the STI 118c after the patterning of the HV gate dielectric layer 124, and the notched corner C has a bottom substantially level with top of the STI 118b.

Figure 16:
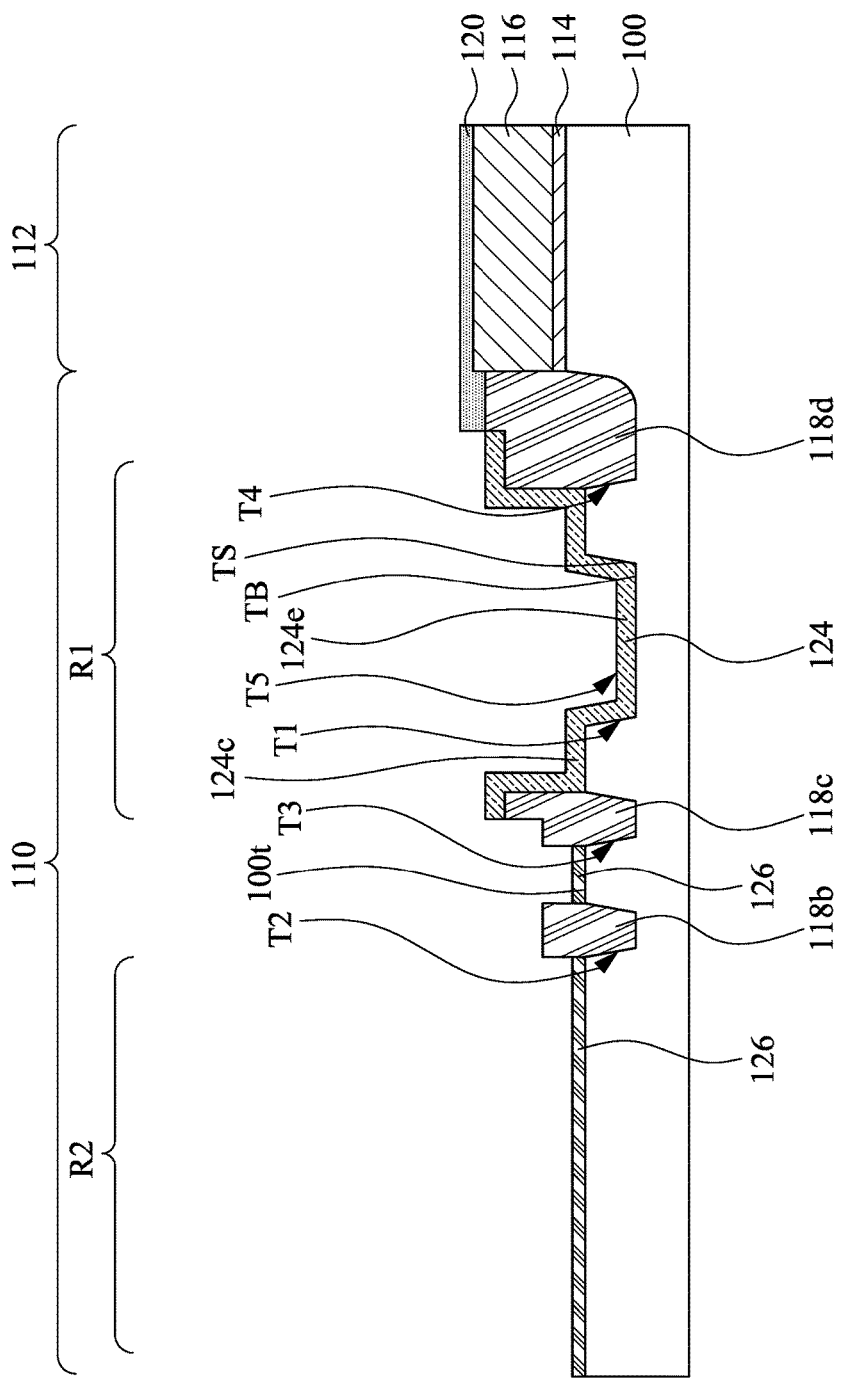

Reference is made to FIG. 16. Oxide layer 126 is formed at least on a predetermined memory region R2 of the semiconductor substrate 100. Formation of the oxide layer 126 may include blanket forming a layer of oxide over the semiconductor substrate 100 using, for example, thermal oxidation or deposition, and patterning this layer to form the oxide layer 126.

Figure 17:
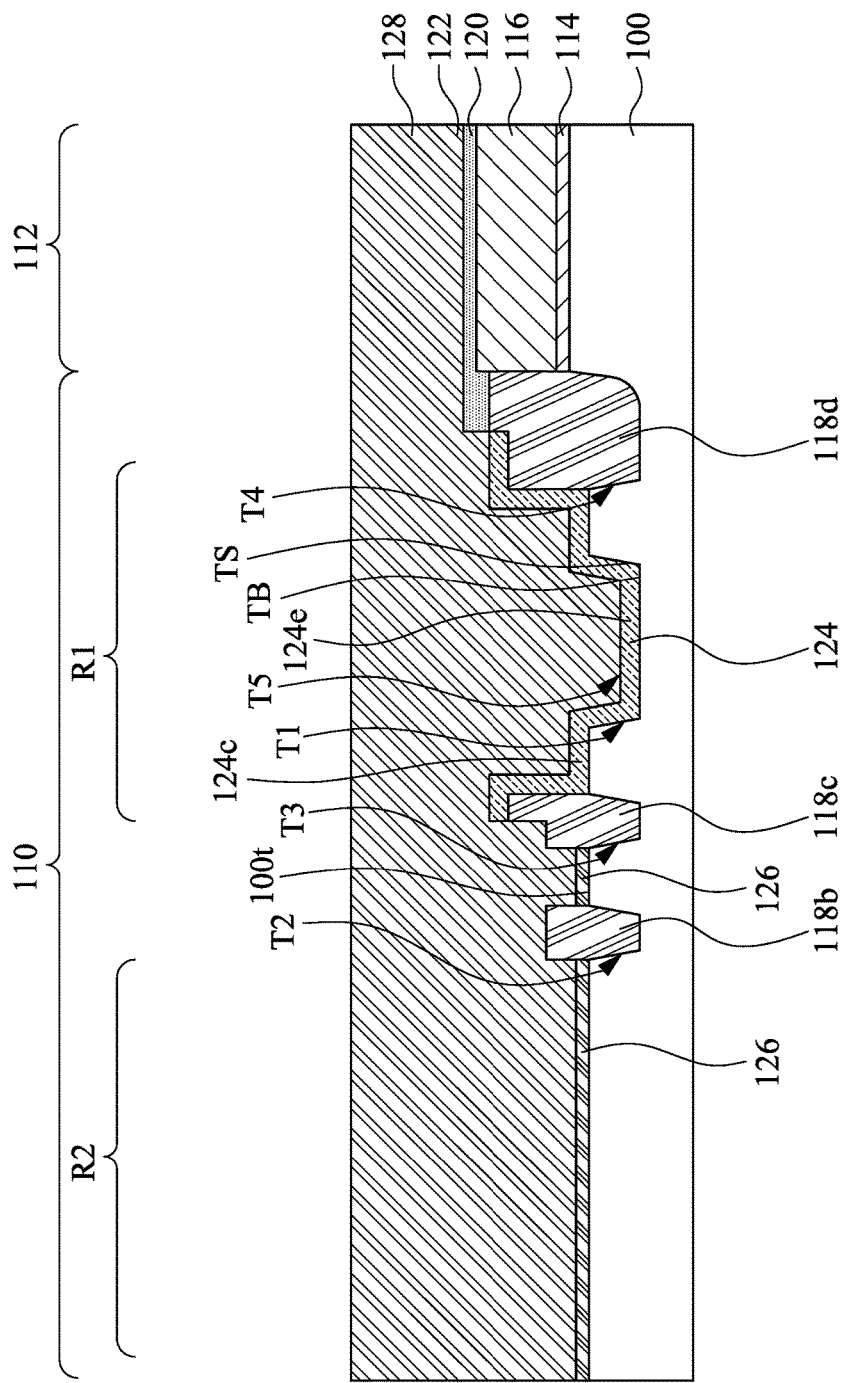

Next, as illustrated in FIG. 17, floating gate layer 128 is formed over the semiconductor substrate 100. More particularly, the floating gate layer 128 can overfill trench of the HV gate dielectric layer 124 in the HV region R1 and cover the oxide layer 126 in the memory region R2. Stated differently, portion of the floating gate layer 128 is formed over the HV gate dielectric layer 124 and fills remaining the shallow trench T1, and another portion of the floating gate layer 128 is formed over the oxide layer 126. In some exemplary embodiments, floating gate layer 128 includes polysilicon, which may be implanted with a p-type or an n-type impurity, followed by an anneal step to activate the implanted impurity. In alternative embodiments, other conductive materials such as metal or metal alloys can be used to form floating gate layer 128. In some embodiments, the floating gate layer 128 may be formed using a conformal deposition technique, such as CVD.

Figure 18:
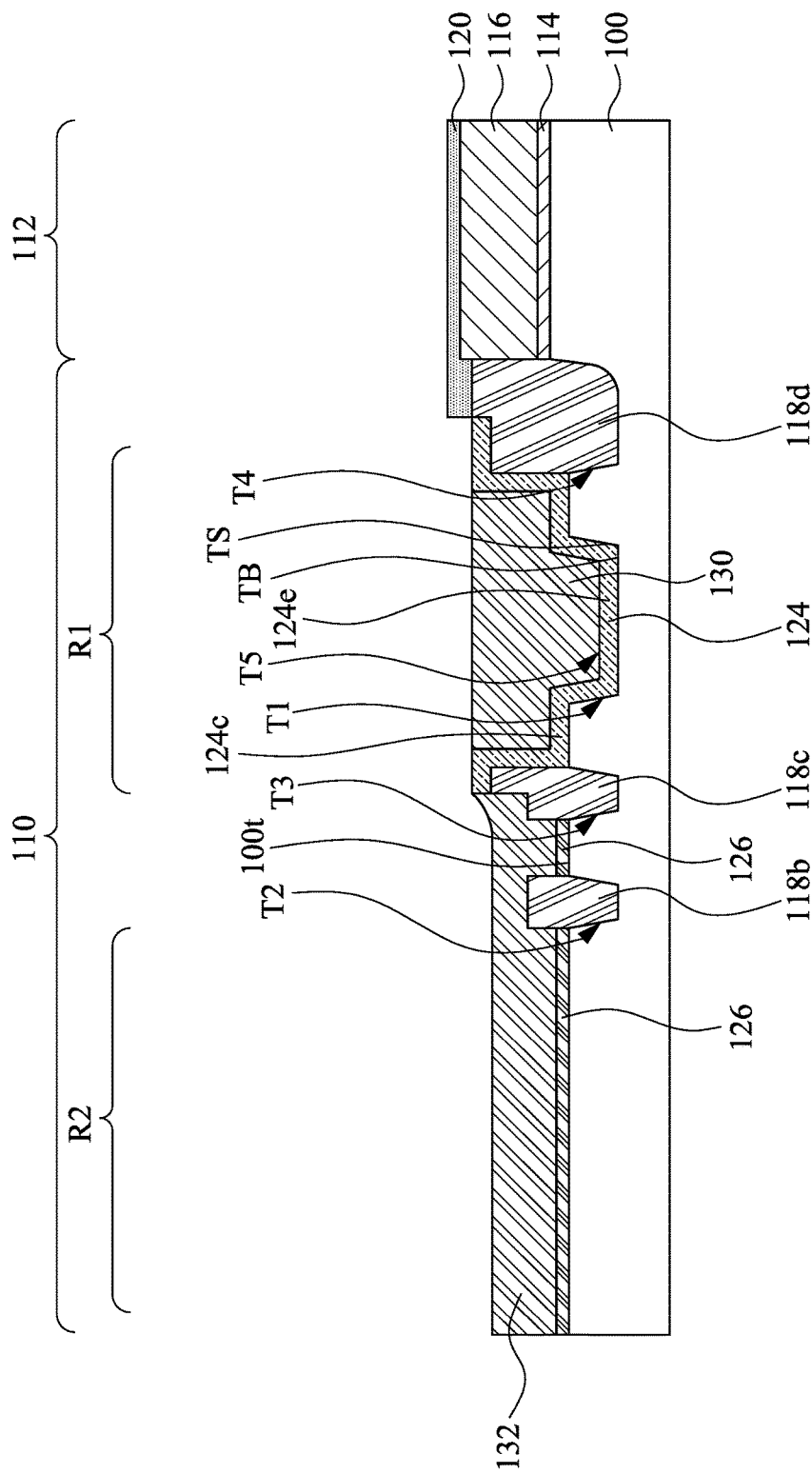

Thereafter, upper portion of the floating gate layer 128 higher than top of the HV gate dielectric layer 124 is removed using for example, CMP, and hence remaining floating gate material over HV region R1 and that over memory region R2 are spaced apart at least by the HV gate dielectric layer 124. The resulting structure is shown in FIG. 18. Remaining floating gate material over the HV region R1 can be referred to as HV gate electrode 130 for HV device, and remaining floating gate material over the memory region R2 can be referred to as floating gate layer 132 for memory device. The CMP may use polishing slurry that is selective to material of floating gate layer 128, such as polysilicon, and hence the mask 120 over the non-recessed region 112 may remain and may be raised with respect to the HV gate electrode 130 and floating gate layer 132. Moreover, top surface of the HV gate electrode 130 may be higher than that of the floating gate layer 132 due to the fact that the HV gate electrode 130 is embedded in the HV gate dielectric layer 124. In other words, top surface of the HV gate electrode 130 may be substantially level with that of the HV gate dielectric layer 124, and these top surfaces are higher than that of the floating gate layer 132 at this stage.

Figure 19:
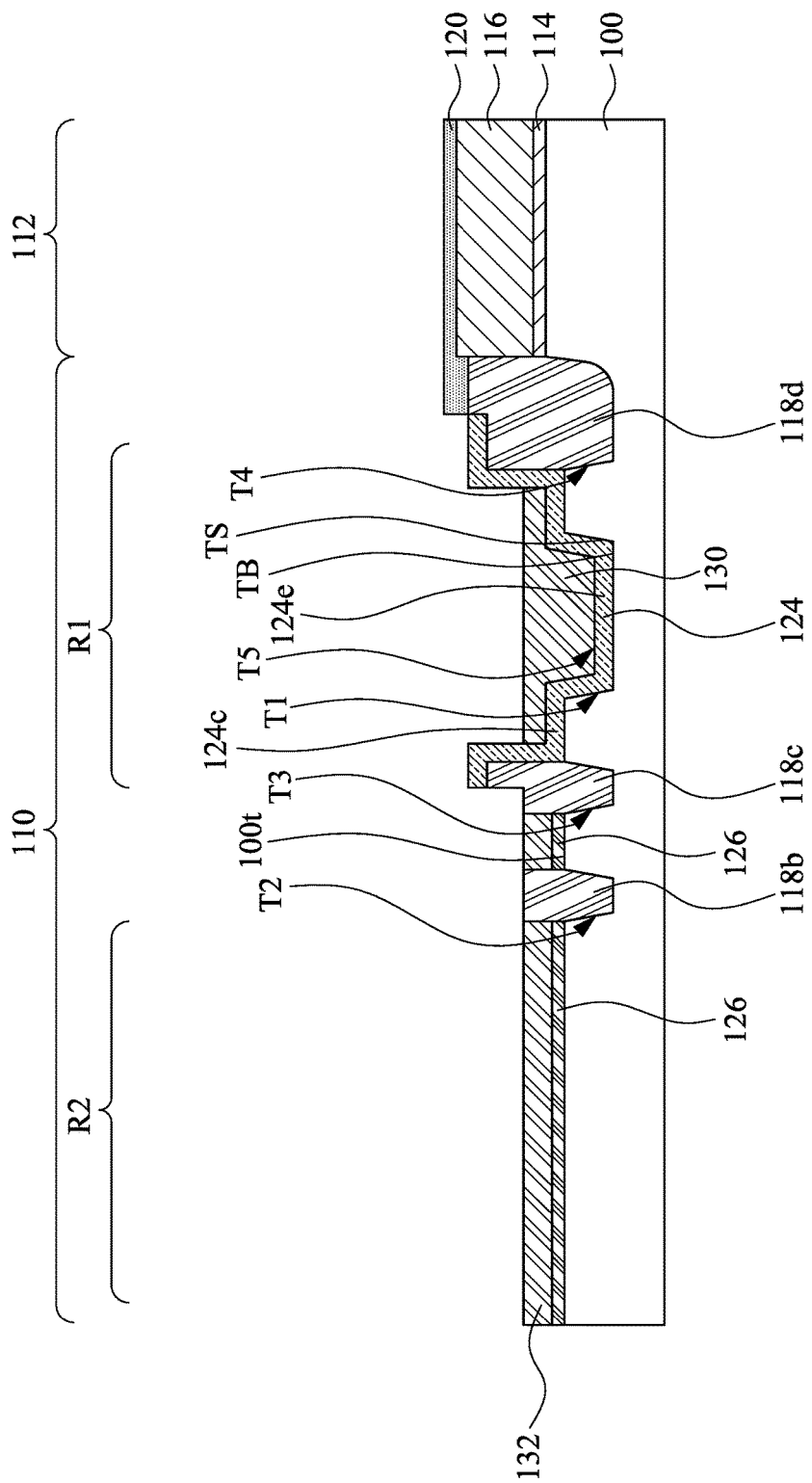

Reference is made to FIG. 19. Etch operation is performed to the HV gate electrode 130 and the floating gate layer 132 to remove upper portions thereof. After the etch operation, top surface of the floating gate layer 132 may be substantially level with that of the STI 118b. In some embodiments, after the etch operation, top surface of the floating gate layer 132 may be substantially level with that of the HV gate electrode 130. The etch operation may be selective to polysilicon. In some embodiments, the etch operation may be a wet etching process, a dry etching process, or combinations thereof. For example, a wet etching process for removing polysilicon may include exposure to a hydroxide containing solution (e.g., ammonium hydroxide), deionized water, and/or other suitable etchant solutions.

Figure 20:
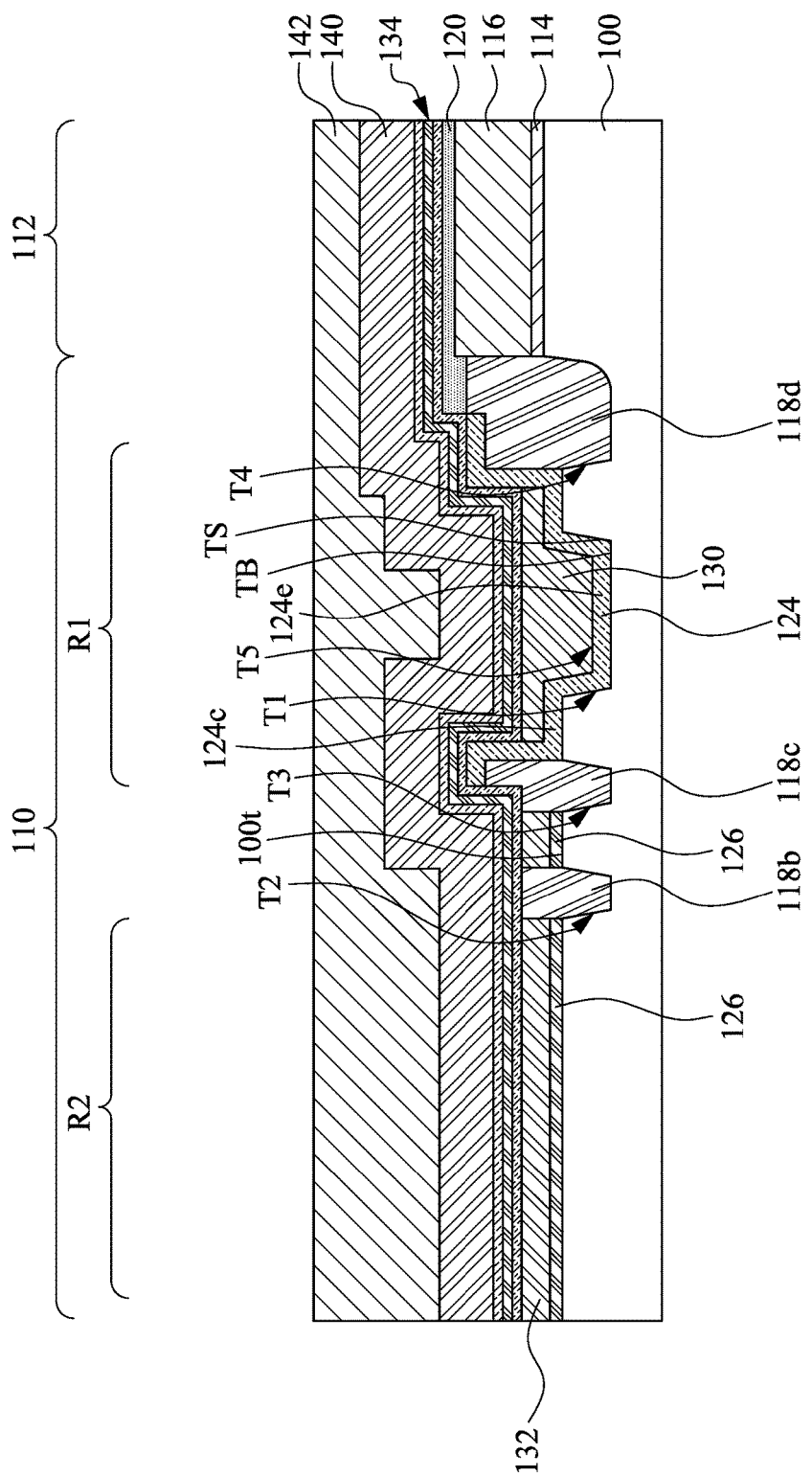

Reference is made to FIG. 20. Inter-gate dielectric layer 134, control gate layer 140, and a memory hard mask layer 142 are then formed stacked over the semiconductor substrate 100. The inter-gate dielectric layer 134 is formed conformally lining the floating gate layer 132. In some embodiments, the inter-gate dielectric layer 134 may be formed of a multi-layer nitride oxide nitride (ONO) film. The control gate layer 140 is formed over the inter-gate dielectric layer 134, and the memory hard mask layer 142 is formed over the control gate layer 140. In some embodiments, the control gate layer 140 can be formed of a conductive material, such as doped polysilicon. In some embodiments, the memory hard mask layer 142 can be formed of a nitride, such as silicon nitride. The inter-gate dielectric layer 134, the control gate layer 140, and the memory hard mask layer 142 may be formed using a deposition technique, such as CVD.

Figure 21:
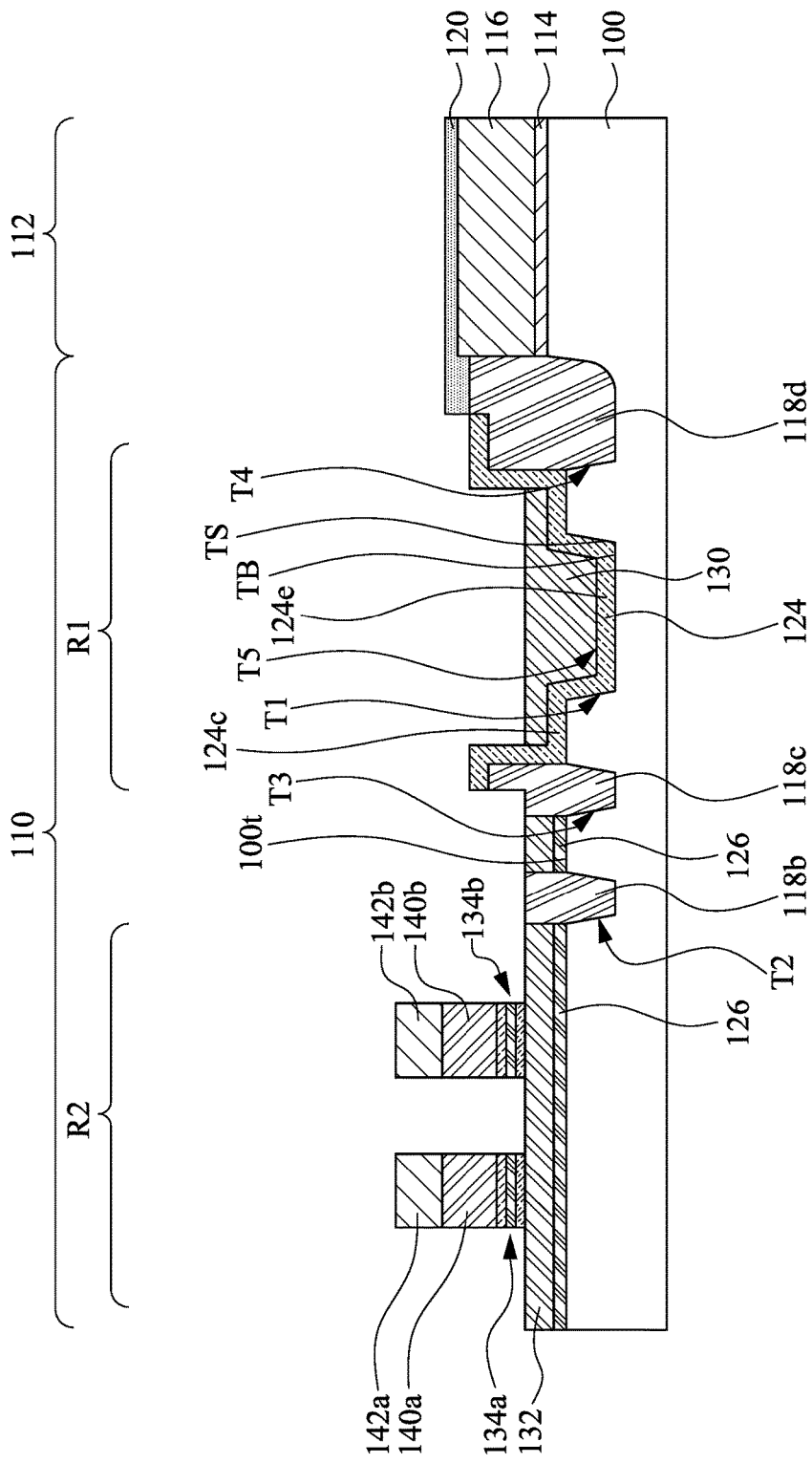

Thereafter, as illustrated in FIG. 21. Etch operation is performed through the memory hard mask layer 142, the control gate layer 140, and the inter-gate dielectric layer 134 to form a pair of spaced control gates 140a and 140b. In some embodiments, this etch operation is performed using photoresist. For example, a layer of photoresist can be deposited on the memory hard mask layer 142. The photoresist layer is then patterned to create a mask masking control gate regions. With the mask generated, the etch operation can be performed and the mask is then removed.

The formed control gates 140a and 140b are each sandwiched between an inter-gate dielectric 134a, 134b and a memory hard mask 142a, 142b, and each rest atop the floating gate layer 132. The inter-gate dielectric 134a may electrically isolates the floating gate layer 132 from the control gate 140a, and the memory hard mask 142a masks the control gate 140a during manufacture. Similarly, the inter-gate dielectric 134b may electrically isolates the floating gate layer 132 from the control gate 140b, and the memory hard mask 142b masks the control gate 140b during manufacture.

Figure 22:
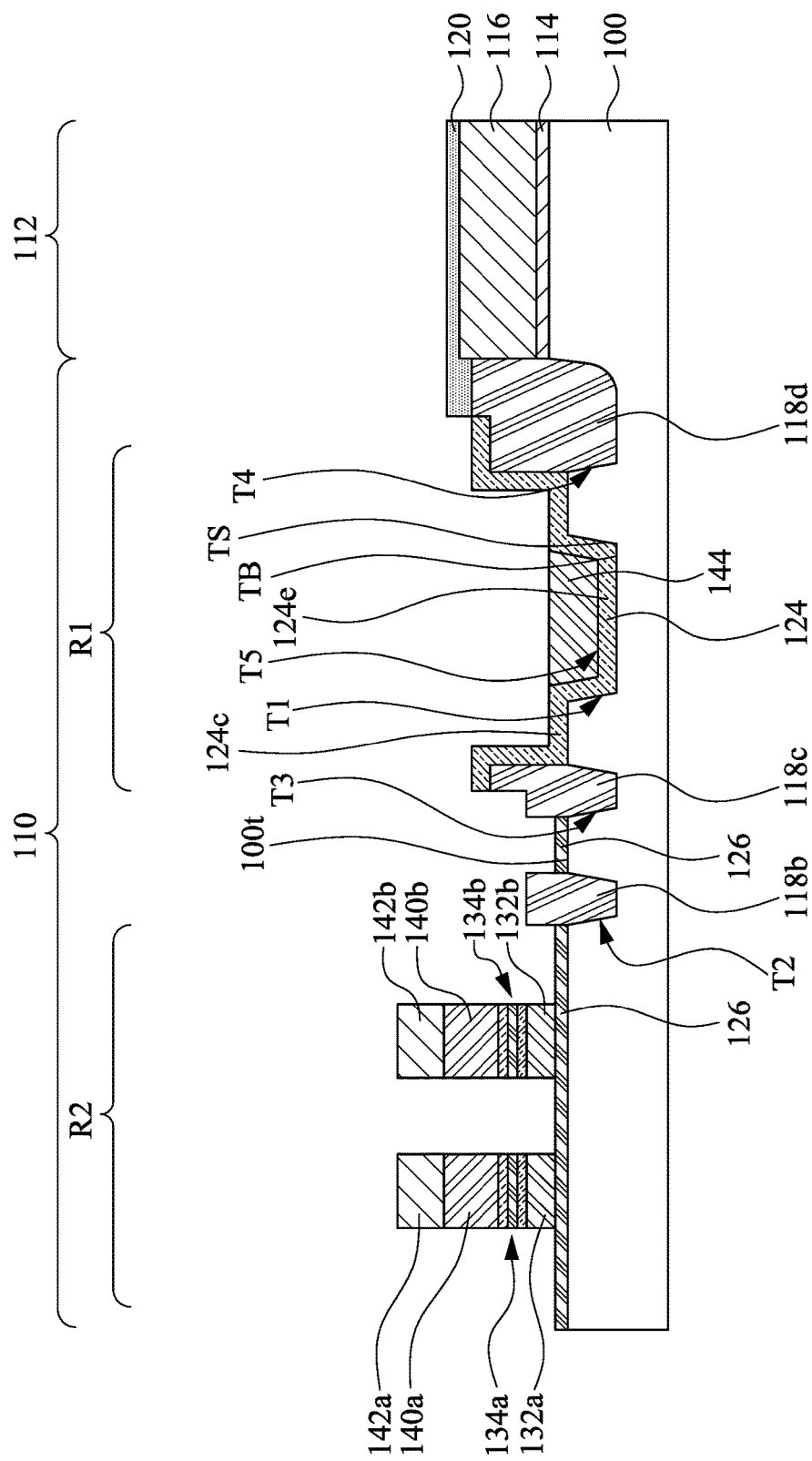

Thereafter, as illustrated in FIG. 22, etch operation is performed to the HV gate electrode 130 to form embedded HV gate electrode 144 over the shallow trench T1. In particular, an upper portion of the HV gate electrode 130 over the top surface 100t of the semiconductor substrate 100 is removed. In other words, a portion of the HV gate electrode 130 not over the shallow trench T1 is removed, while leaving remaining portion of the HV gate electrode 130 over the shallow trench T1, and this remaining portion can be referred to as embedded HV gate electrode 144. The embedded HV gate electrode 144 is at least partially embedded in the shallow trench T1. For example, as illustrated, majority of the embedded HV gate electrode 144 is embedded in the shallow trench T1, and hence the embedded HV gate electrode 144 and the shallow trench T1 may taper in the same direction. That is, the embedded HV gate electrode 144 may taper in a direction toward the semiconductor substrate 100. In some embodiments, a top portion of the embedded HV gate electrode 144 is raised above the top surface 100t of the semiconductor substrate 100. Further, as illustrated, the embedded HV gate electrode 144 is embedded in the trench T5 defined by the HV gate dielectric layer 124. In other words, top surface of the cap portion 124c of the HV gate dielectric layer 124 is substantially free from coverage of the embedded HV gate electrode 144. In some embodiments, top surface of the cap portion 124c may be substantially level with that of the embedded HV gate electrode 144. In some alternative embodiments, top surface of the embedded HV gate electrode 144 may be lower than that of the cap portion 124c.

Because majority of the embedded HV gate electrode 144 is embedded in the shallow trench T1, this embedding may be advantageous to mitigate damage to the HV gate electrode 144 caused by CMP in gate replacement process for HKMG device. Moreover, the etch operation of removing upper portion of the HV gate electrode 130 may be advantageous to make top surface 100t of the semiconductor substrate 100 substantially free from coverage of the HV gate electrode 130, and hence source/drain regions can be formed in the HV region R1 of the semiconductor substrate 100. In some embodiments, the etch operation may be selective to polysilicon. In some embodiments, the etch operation may be a wet etching process, a dry etching process, or combinations thereof. For example, a wet etching process for removing polysilicon may include exposure to a hydroxide containing solution (e.g., ammonium hydroxide), deionized water, and/or other suitable etchant solutions.

In some embodiments where the HV gate electrode 130 and the floating gate layer 132 have substantially the same material, such as polysilicon, the floating gate layer 132 unmasked by the memory hard masks 142a and 142b can be removed during the etch operation performed to the HV gate electrode 130, while leaving floating gates 132a and 132b under the memory hard masks 142a and 142b. In some alternative embodiments, the etching of the floating gate layer 132 and that of the HV gate electrode 130 can be performed by different processes. In some embodiments, the floating gates 132a and 132b have top surfaces higher than that of the embedded HV gate electrode 144 due to the fact that the HV gate electrode 144 is embedded in the shallow trench T1. Similarly, the floating gates 132a and 132b have bottom surfaces higher than that of the embedded HV gate electrode 144.

Figure 23:
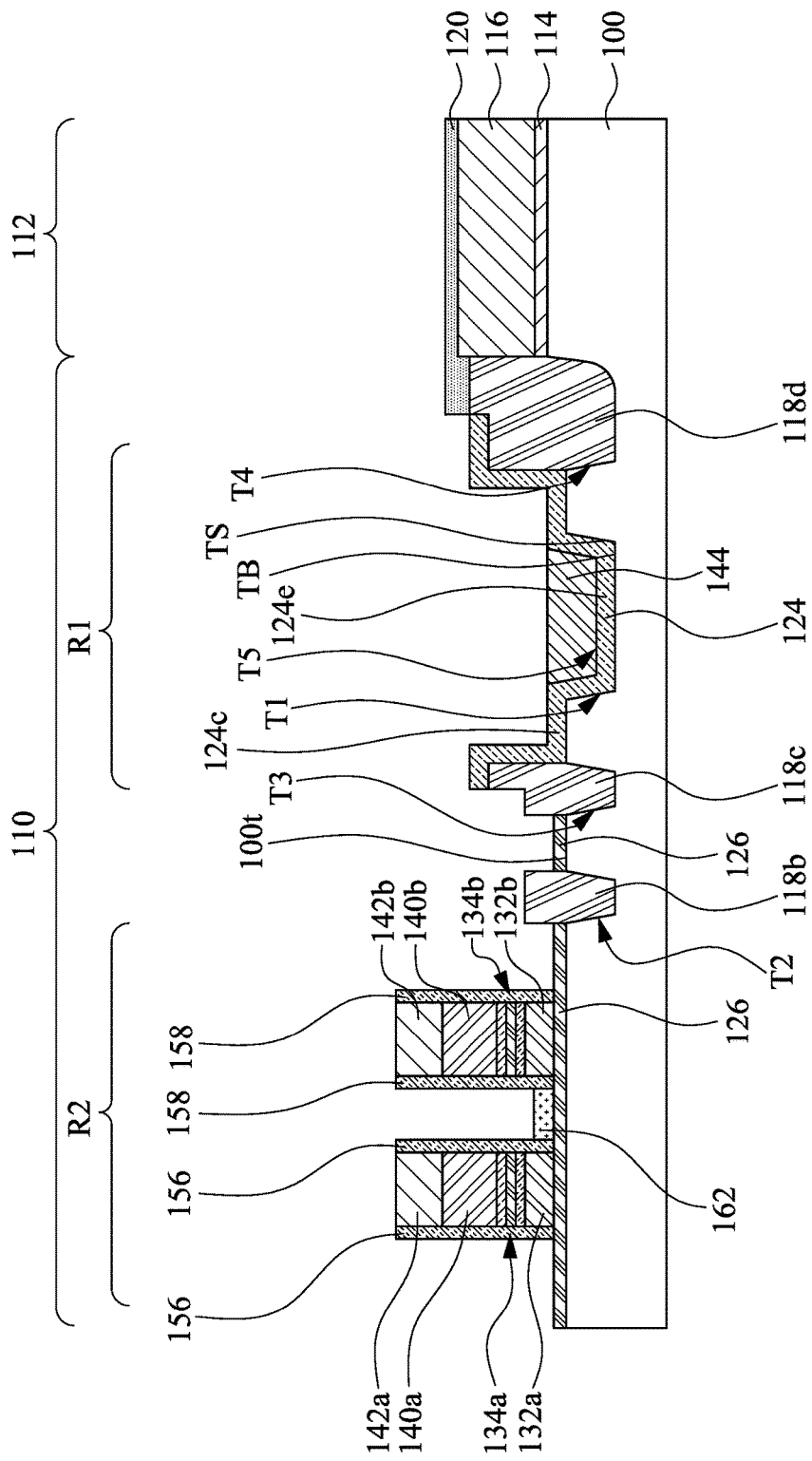

Reference is made to FIG. 23. A pair of gate spacers 156 and a pair of gate spacers 158 are formed on the semiconductor substrate 100. The gate spacers 156 extend along sidewalls of the floating gate 132a, inter-gate dielectric 134a, control gate 140a and memory hard mask 142a. The gate spacers 158 extend along sidewalls of the floating gate 132b, inter-gate dielectric 134b, control gate 140b and memory hard mask 142b. These gate spacers 156 and 158 can be formed by the same process or different processes. In some embodiments where these gate spacers 156 and 158 are formed by the same process, they may have substantially the same material. In some embodiments, the gate spacers 156 and 158 may include silicon oxide, silicon nitride, silicon oxy-nitride, or other suitable material. The gate spacers 156 and 158 may include a single layer or multilayer structure. To form the gate spacers 156 and 158, a blanket dielectric layer may be formed over the semiconductor substrate 100 by CVD, PVD, ALD, or other suitable technique. Then, an anisotropic etching is performed on the blanket layer to form the gate spacers 156 and 158.

As illustrated in FIG. 23, inter-poly oxide (IPO) 162 can be next formed between the adjacent gate spacers 156 and 158. The IPO 162 can be used to insulate overlying erase gate from underlying shared source/drain region (not shown). The IPO 162 is thick enough so that a high voltage can be applied on erase gate without causing electrical breakdown of the IPO 162. The IPO 162 may be formed by depositing a dielectric layer, as examples.

Figure 24:
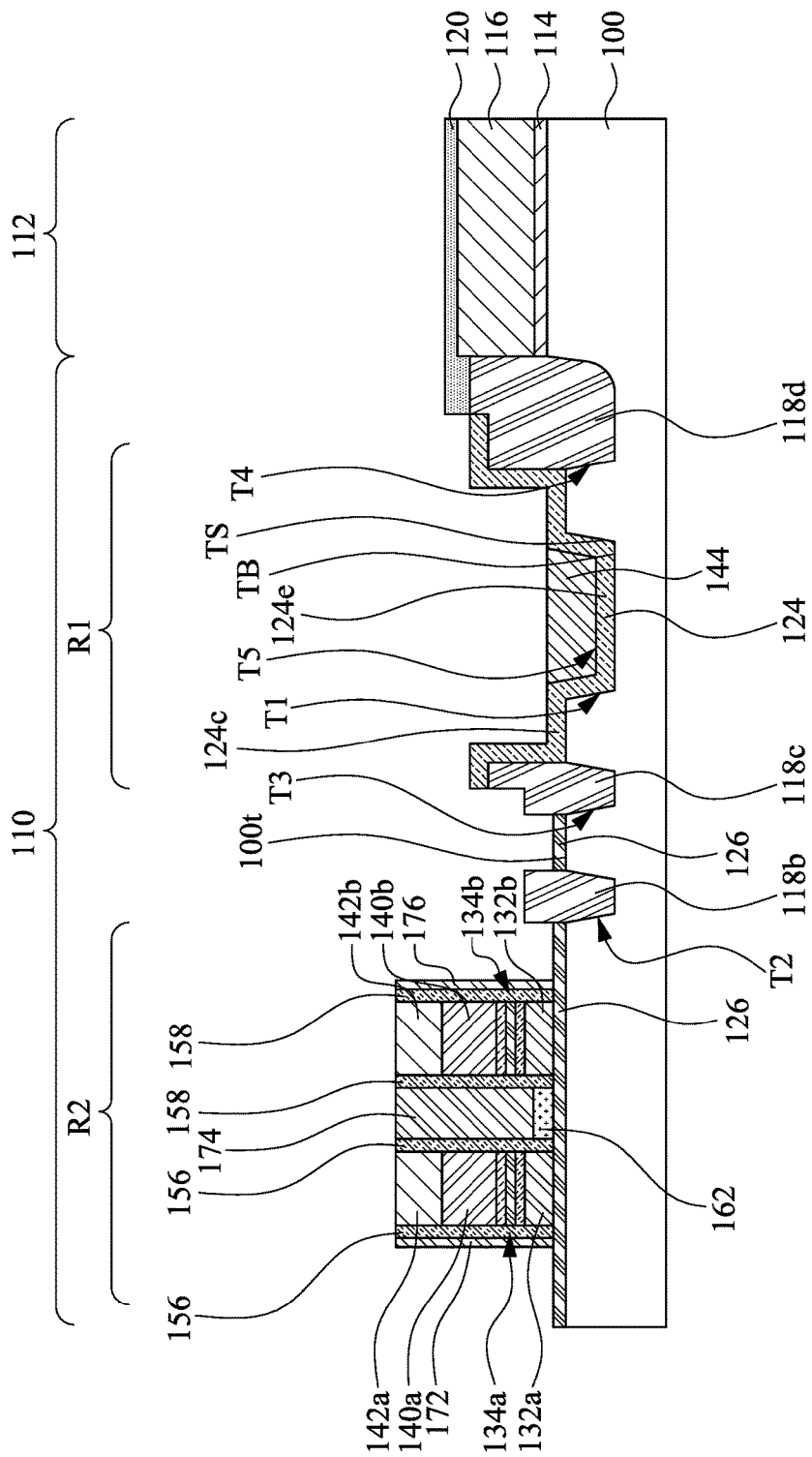

Reference is made to FIG. 24. Erase gate 174 is formed over the IPO 162. Word line 172 is formed along the outside gate spacer 156 that is distal to the erase gate 174, and the word line 176 is formed along the outside gate spacer 158 that is distal to the erase gate 174. In some embodiments, the erase gate 174 and the word lines 172 and 176 can be formed by depositing conductive material, such as polysilicon or metal-containing material comprising metal or metal alloy.

Figure 25:
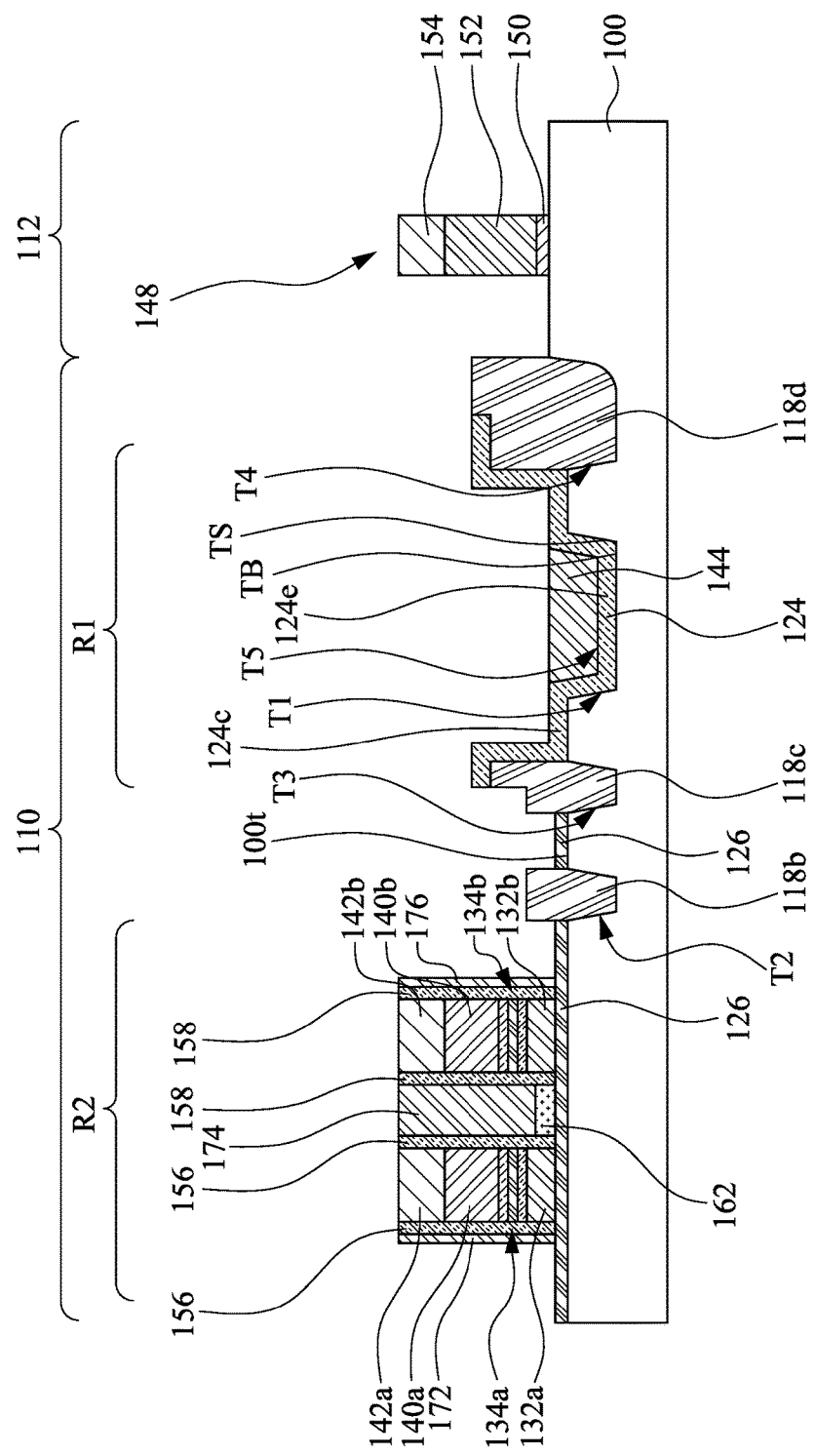

Reference is made to FIG. 25. Pad layer 114, mask layer 116 and the mask 120 over the non-recessed region 112 are removed, and dummy gate structure 148 is then formed over the non-recessed region 112 of the semiconductor substrate 100. At least upper portion of the dummy gate structure 148 is to be replaced later by metal gate (MG) structure after high temperature thermal processes, such as thermal annealing for source/drain activation during the sources/drains formation. In some embodiments, the dummy gate structure 148 includes gate dielectric 150, dummy gate electrode 152 and gate mask 154. In some embodiments, the gate dielectric 150 may include, for example, silicon oxide, a high-k dielectric material or multi-layer of them. The high-k dielectric material may include metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the higk-k dielectric material may include hafnium oxide ($HfO_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide (BaTiO$_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In alternative embodiments, the gate dielectric 150 may have a multilayer structure such as one layer of silicon oxide (e.g., interfacial layer) and another layer of high-k material. In some embodiments, the dummy gate electrode 152 may include polysilicon, and the gate mask 154 may include silicon nitride, as examples. During formation of the dummy gate structure 148, the recessed region 110 may be masked. In other words, at least the embedded HV gate electrode 144, the HV gate dielectric layer 124, and structures over the memory region R2 can be protected from processes for forming the dummy gate structure 148.

Figure 26:
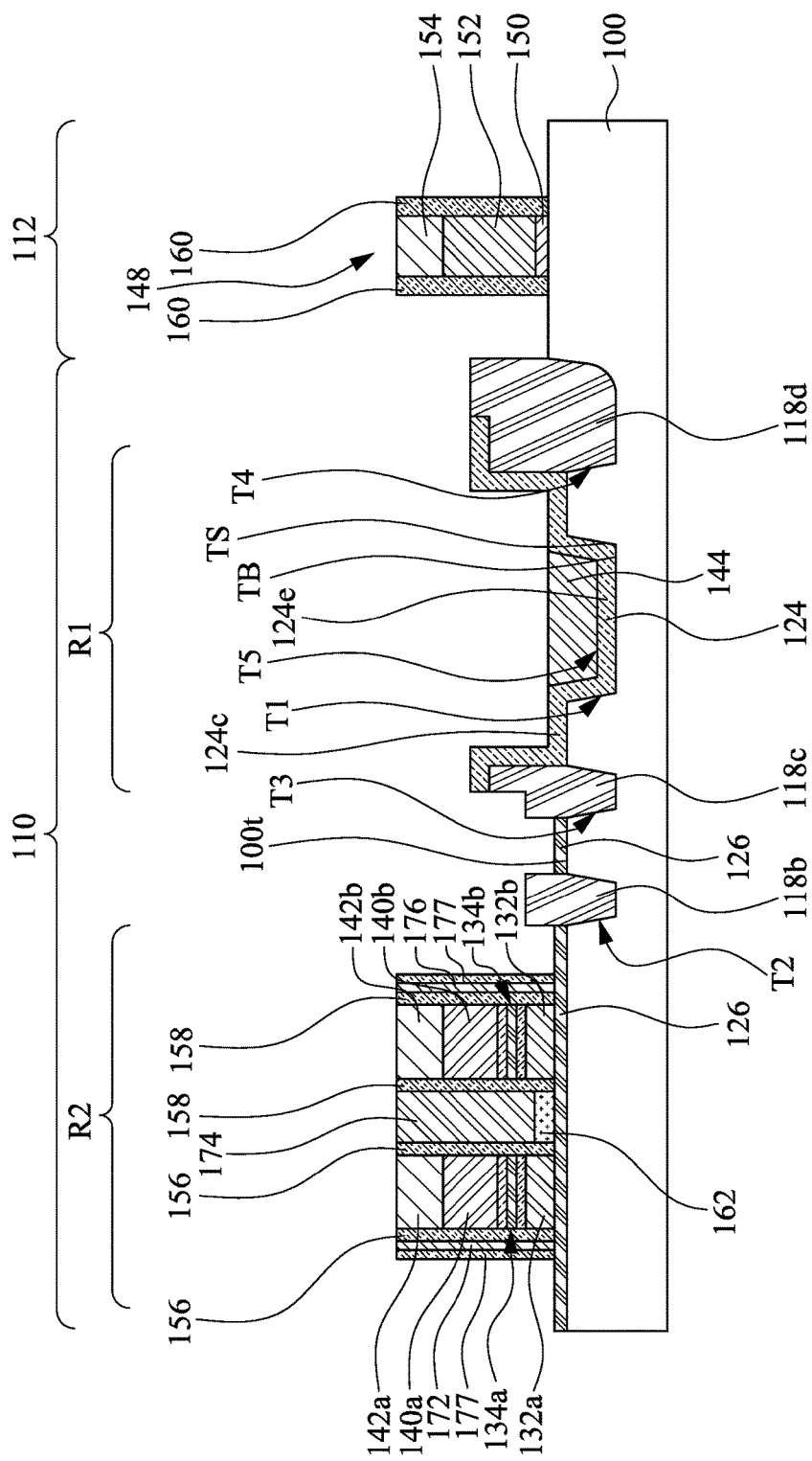

Reference is made to FIG. 26. A pair of spacers 177 and a pair of gate spacers 160 are formed on the semiconductor substrate 100. The spacers 177 extend along sidewalls of the word lines 172 and 176. The gate spacers 160 extend along sidewalls of the dummy gate structure 148. These spacers 177 and 160 can be formed by the same process or different processes. In some embodiments where these spacers 177 and 160 are formed by the same process, they may have substantially the same material. In some embodiments, the spacers 177 and 160 may include silicon oxide, silicon nitride, silicon oxy-nitride, or other suitable material. The spacers 177 and 160 may include a single layer or multilayer structure. To form the spacers 177 and 160, a blanket layer may be formed over the semiconductor substrate 100 by CVD, PVD, ALD, or other suitable technique. Then, an anisotropic etching is performed on the blanket layer to form the gate spacers 177 and 160. In some embodiments, the spacers 177 and 160 can be used to offset subsequently formed doped regions, such as source/drain regions.

Figure 27:
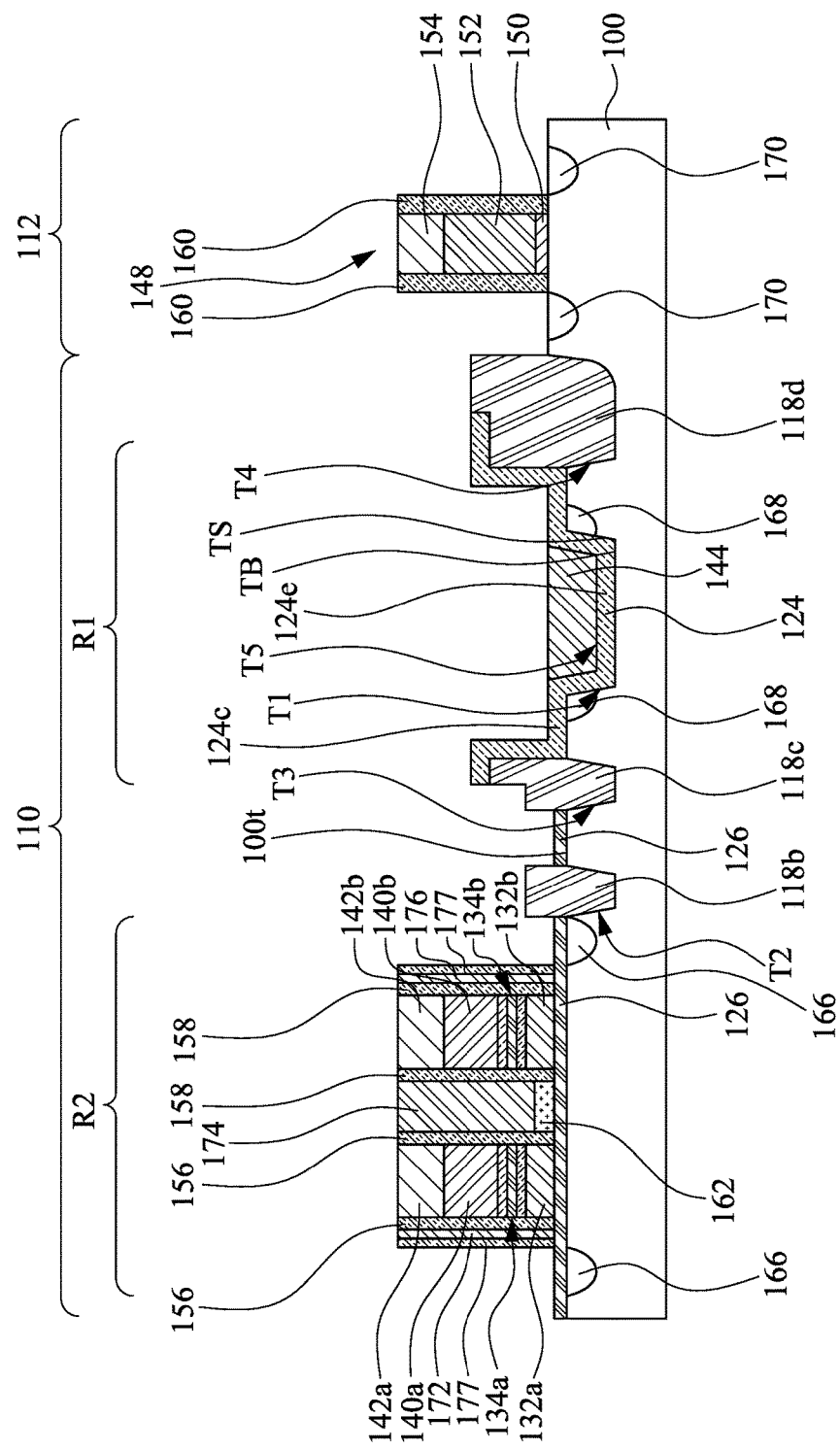

Reference is made to FIG. 27. Two individual source/drain regions 166 (individual to the split gate flash memory cells) are then formed in the memory region R2 of the semiconductor substrate 100. Source/drain regions 168 are formed in the HV region R1 of the semiconductor substrate 100, and source/drain regions 170 are formed in non-recessed region 112 of the semiconductor substrate 100. The source/drain regions 166, 168 and 170 can be formed using one or more implantation processes to dope the predetermined regions of the semiconductor substrate 100. The doping species include P-type dopants, such as boron or $BF_2$; N-type dopants, such as phosphorus or arsenic; and/or other suitable dopants including combinations thereof. One or more annealing processes may be optionally performed to activate these source/drain regions. The annealing processes include rapid thermal annealing (RTA) and/or laser annealing processes.

In the HV region R1, the source/drain regions 168 are proximate the shallow trench T1. In some embodiments, the source/drain regions 168 are respectively adjacent to opposite sides of the shallow trench T1. Stated differently, the shallow trench T1 is present between the source/drain regions 168. In some embodiments, as illustrated, the source/drain region 168 is formed at corner between the top surface 100*t* of the semiconductor substrate 100 and the trench sidewall TS of the shallow trench T1. The source/drain regions 168 abut the embedded portion 124*e* of the HV gate dielectric layer 124. More particularly, the embedded portion 124*e* includes inner and outer sidewalls extending into the shallow trench T1, and the inner and outer sidewalls respectively abut the embedded HV gate electrode 144 and the source/drain regions 168. In some embodiments, the cap portion 124*c* of the HV gate dielectric layer 124 may cap the source/drain regions 168. As such, the cap portion 124*c* may act as screening oxide for implantation screening and reduction of the channeling effect during the implantation for forming the source/drain regions 168.

In the memory region R2, the individual source/drain regions 166 are spaced apart with a shared source/drain region, which is not shown in the figures and can be formed in previous stage during fabrication, in the middle of the two individual source/drain regions 166. Each individual source/drain region 166 and the shared source/drain region define a semiconductor channel therebetween. The individual source/drain regions 166 are of an opposite type (i.e., p- or n-type) as the semiconductor substrate 100.

In the non-recessed region 112, the source/drain regions 170 are proximate the gate spacers 160. In some embodiments, the source/drain regions 170 may be formed by performing implantation through top surface of the semiconductor substrate 100. In some other embodiments, the source/drain regions 170 may include forming recesses in the semiconductor substrate 100 proximate the gate spacers 160, growing epitaxy structures in the recesses, wherein the epitaxy structures can be in-situ doped. If the epitaxy structures are not in-situ doped, a second implantation process (i.e., a junction implant process) is performed to dope the epitaxy structures.

Figure 28:
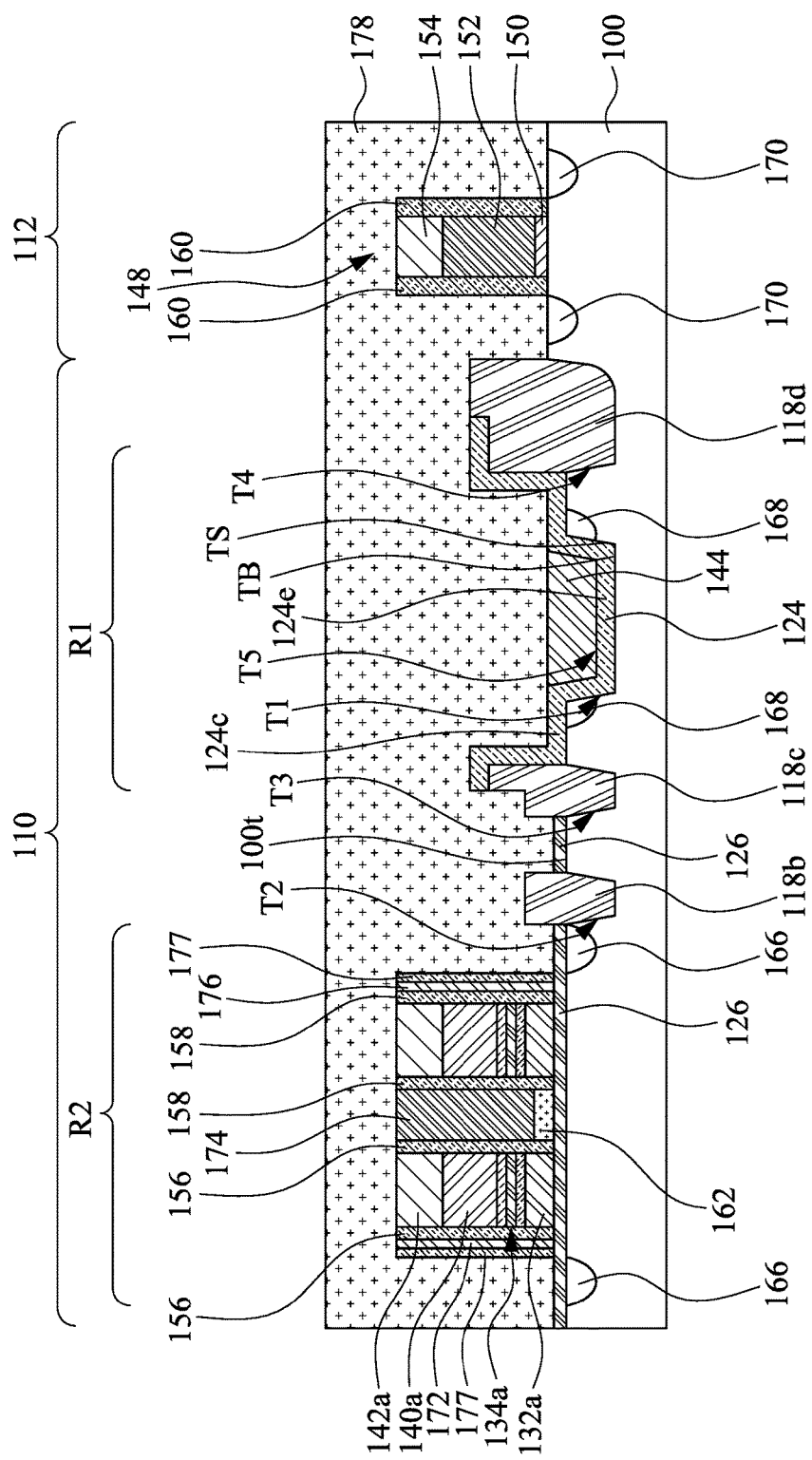
Figure 29:
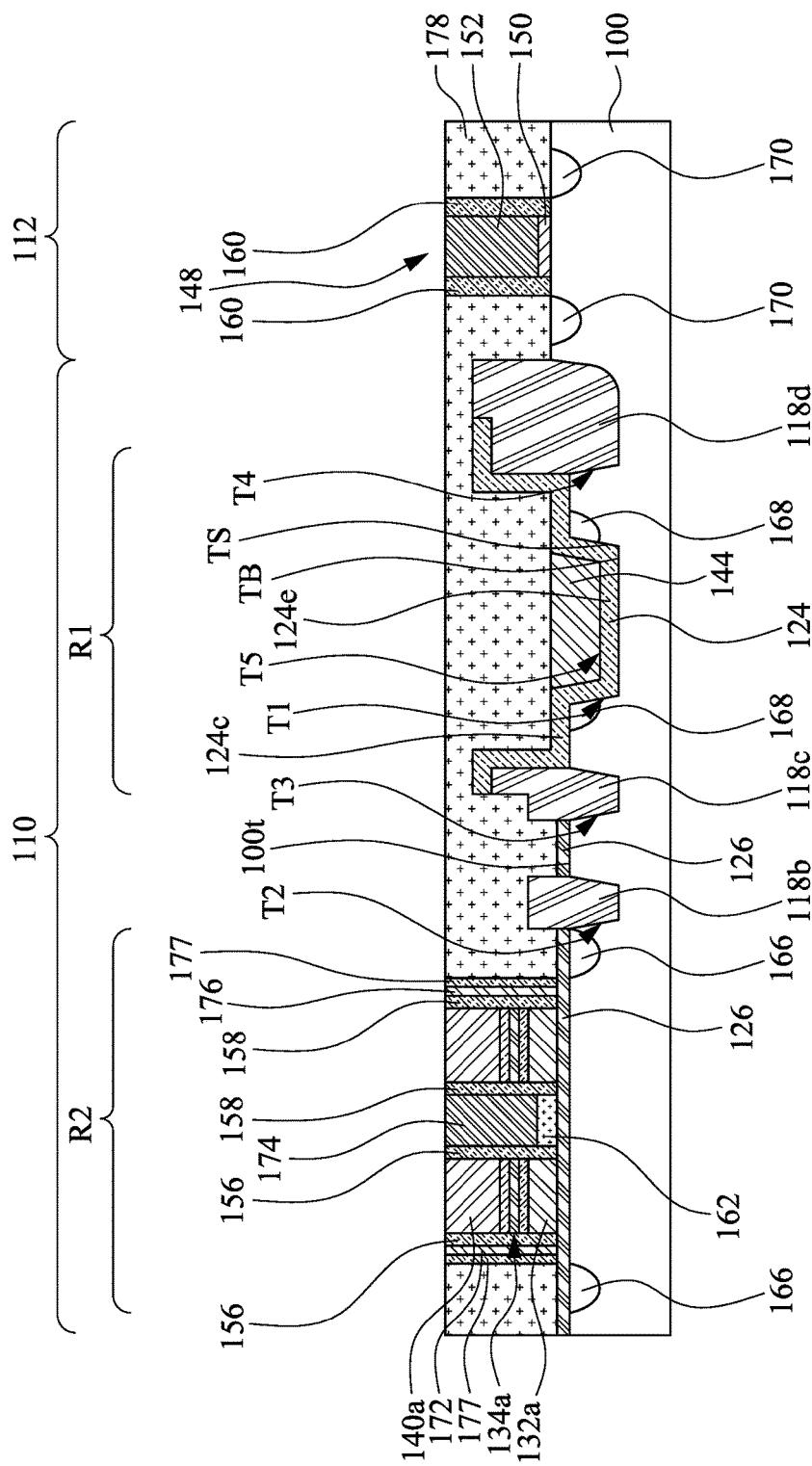

Reference is made to FIG. 28. Interlayer dielectric (ILD) layer 178 is formed over the semiconductor substrate 100. The ILD layer 178 includes silicon oxide, silicon nitride, silicon oxynitride, silicon carbide, low-dielectric constant dielectric material or a combination thereof. The ILD layer 178 includes a single layer or multiple layers. The ILD layer 178 can be formed by a suitable technique, such as CVD. A chemical mechanical planarization (CMP) process may be applied to remove excessive ILD layer 178 and expose top surface of the dummy gate electrode 152 to a subsequent dummy gate removal process, and the resulting structure is shown in FIG. 29. During the CMP process, the embedded HV gate electrode 144 is covered and protected by the ILD layer 178. This is due to that the embedded HV gate electrode 144 is embedded in the shallow trench T1 and thus has a top surface lower than that of the dummy gate electrode 152. Accordingly, this embedding may be advantageous to mitigate damage to the HV gate electrode 144 caused by this CMP.

Figure 30:
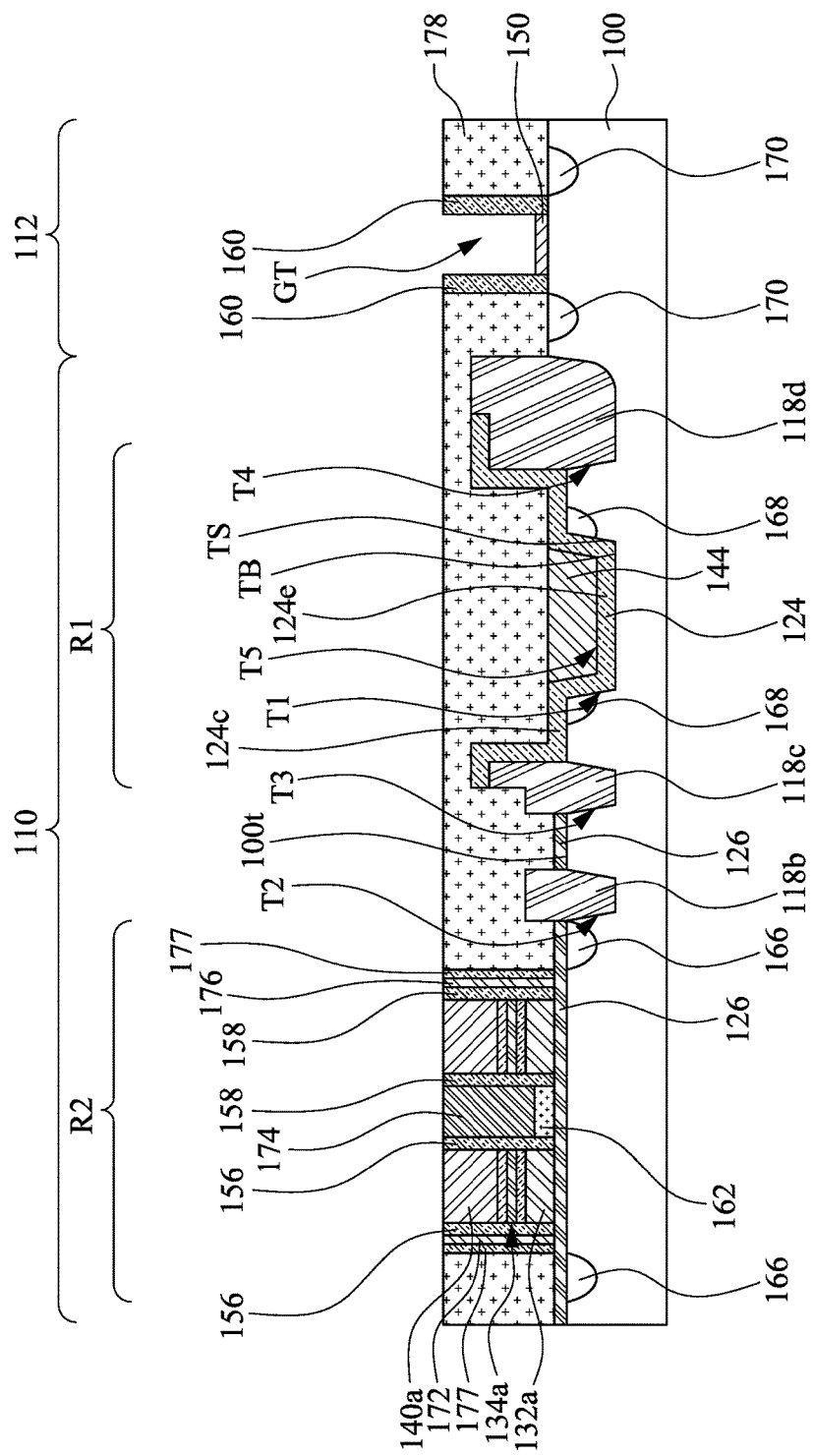

Next, the dummy gate electrode 152 is removed to form a gate trench GT with the gate spacers 160 as its sidewalls, and the resulting structure is shown in FIG. 30. In some embodiments, the removal can be performed using dry etching, wet etching, or combinations thereof. In some embodiments, the dry etching process includes, for example, using an etching gas such as $CF_4$, Ar, $NF_3$, $Cl_2$, He, HBr, $O_2$, $N_2$, $CH_3F$, $CH_4$, $CH_2F_2$, or combinations thereof. In some embodiments, the dry etching process is performed at a temperature in a range from about 20° C. to about 80° C. In some embodiments, the dry etching process is performed at a pressure in a range from about 1 mTorr to about 100 mTorr. In some embodiments, the dry etching process is performed at a power in a range from about 50 W to about 1500 W.

Figure 31:
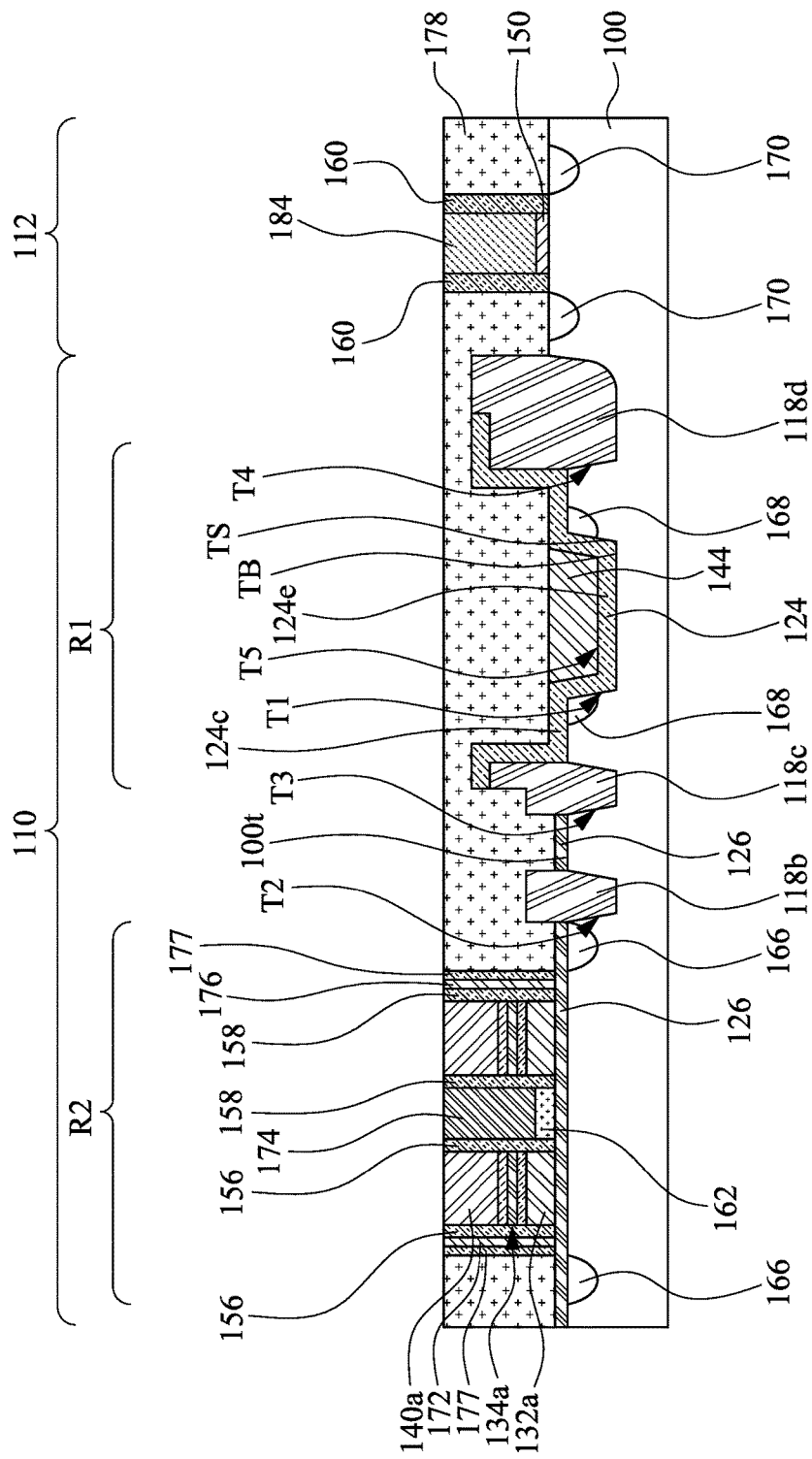

Reference is made to FIG. 31. Gate metal 184 is formed in the gate trench GT and over the gate dielectric 150. In some embodiments where the gate dielectric 150 is made of high-k dielectric material, the high-k gate dielectric 150 and the overlying gate metal 184 can be in combination referred to as a HKMG structure.

Gate metal 184 may include work function metals to provide a suitable work function for the HKMG structure. In some embodiments, the work function metal may include one or more n-type work function metals (N-metal) for forming an n-type transistor on the non-recessed region 112. The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the work function metal may include one or more p-type work function metals (P-metal) for forming a p-type transistor on the non-recessed region 112. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. Gate metal 184 may optionally include filling metal to fill a recess in the work function metal. The filling metal may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Exemplary method of forming the gate metal 184 may include blanket forming one or more work function metal layers over the substrate 100, forming a filling metal layer over the work function metal layers, wherein some portions of these deposited materials overfill the gate trench GT shown in FIG. 30, and performing a CMP process to remove excessive materials of the filling metal layer and the one or more work function metal layers outside the gate trench GT. During this CMP process, the embedded HV gate electrode 144 is covered and protected by the ILD layer 178, and hence it is advantageous to mitigate damage to the HV gate electrode 144 caused by this CMP process.

Figure 32:
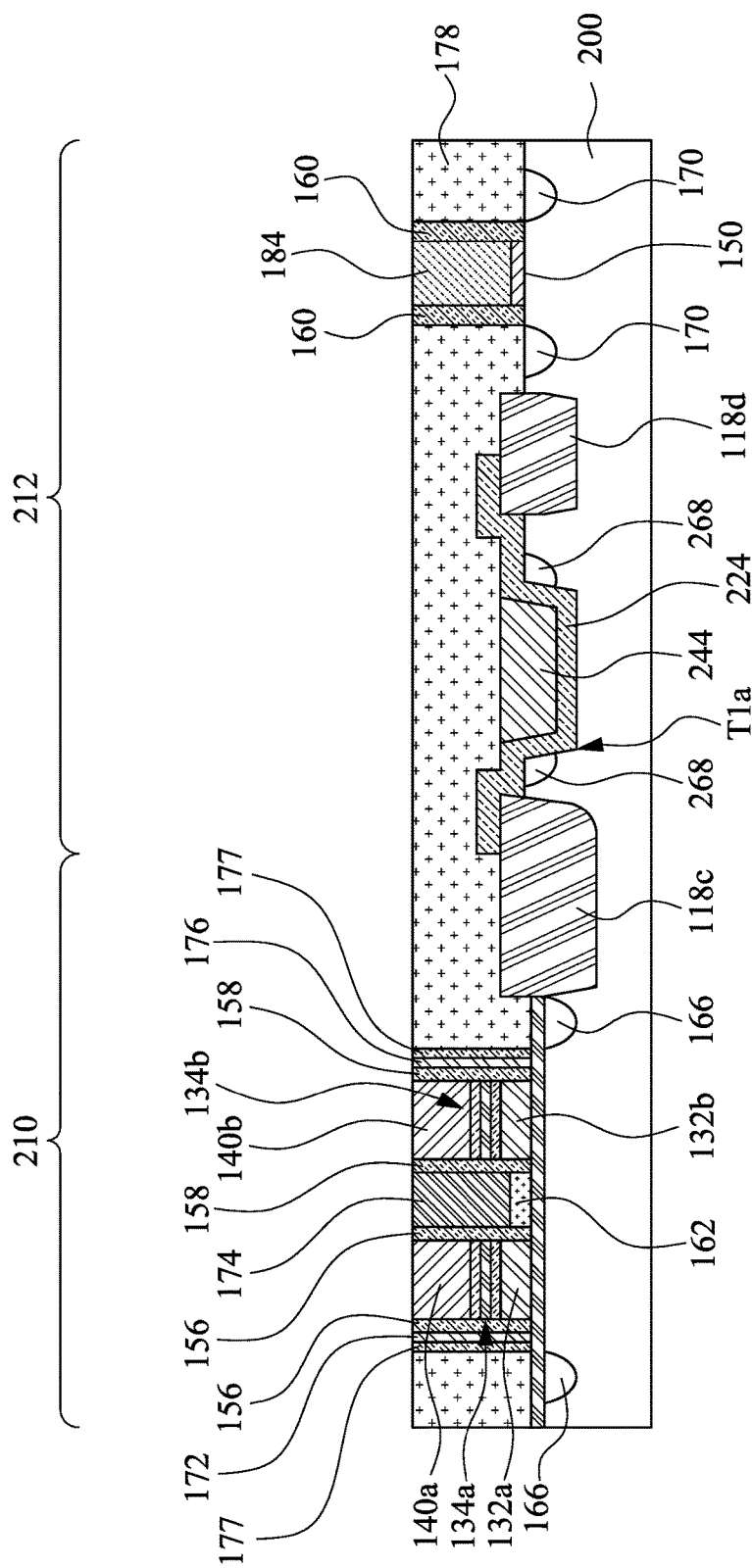
FIG. 32 is a cross-sectional view of a semiconductor device in accordance with some embodiments of the present disclosure.

FIG. 32 illustrates another semiconductor device that shares some of the features of the semiconductor device as discussed previously. For example, the semiconductor device may include control gates 140a, 140b, inter-gate dielectrics 134a, 134b, floating gates 132a, 132b, IPO 162, word lines 172, 176 and an erase gate 174 over a recessed region 210 of a semiconductor substrate 200. Moreover, the semiconductor device includes a HV gate dielectric layer 224 in a shallow trench T1a in a non-recessed region 212 of the semiconductor substrate 200, an embedded HV gate electrode 244 embedded in the HV gate dielectric layer 224, and source/drain regions 268 proximate the shallow trench T1a. The HV gate dielectric layer 224, the embedded HV gate electrode 244, and the source/drain regions 268 can be formed using suitable techniques as discussed previously. The source/drain regions 268 and the embedded HV gate electrode 244 can in combination act as an HV device. Since the HV device is formed in the non-recessed region 212, an extra area in the recessed region 210 for forming the HV device can be omitted.

Embodiments of the present disclosure may have at least following advantages. Majority of the embedded HV gate electrode is embedded in shallow trench in the semiconductor substrate, and therefore, this embedding may be advantageous to mitigate damage to the HV gate electrode caused by CMP in gate replacement process for HKMG device, so that gate height loss of HV device can be prevented.

According to some embodiments, a semiconductor device includes a semiconductor substrate, a gate dielectric layer, a gate electrode and source and drain regions. The gate dielectric layer extends into a first trench in the semiconductor substrate. The gate electrode is over the gate dielectric layer and is at least partially embedded in the first trench in the semiconductor substrate. The source and drain regions are in the semiconductor substrate and proximate the first trench in the semiconductor substrate.

According to some embodiments, a semiconductor device includes a semiconductor substrate, a shallow trench isolation (STI), a dielectric trench liner, a gate electrode and source and drain regions. The STI is in the semiconductor substrate, and the STI has a bottom surface substantially level with a bottom surface of a trench in the semiconductor substrate. The dielectric trench liner lines sidewalls and the bottom surface of the trench of the semiconductor substrate. The gate electrode is over the dielectric trench liner and at least partially embedded in the trench. The source and drain regions are respectively adjacent to opposite sides of the trench.

According to some embodiments, a method of forming a semiconductor device includes forming a plurality of shallow trench isolations (STIs) in a semiconductor substrate, removing one of the STIs to expose a trench in the semiconductor substrate, forming a gate dielectric layer in the exposed trench, and forming a gate electrode over the gate dielectric layer and at least partially in the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor substrate;
a gate dielectric layer extending into a first trench in the semiconductor substrate;
a gate electrode over the gate dielectric layer and at least partially embedded in the first trench in the semiconductor substrate; and
source and drain regions in the semiconductor substrate and proximate the first trench in the semiconductor substrate,
wherein the gate dielectric layer comprises a cap portion capping the source and drain regions, and the cap portion has a top surface substantially level with or higher than a top surface of the gate electrode.

2. The semiconductor device of claim 1, wherein the gate electrode tapers in a direction toward the semiconductor substrate.

3. The semiconductor device of claim 1, wherein the gate electrode and the first trench taper in the same direction.

4. The semiconductor device of claim 1, wherein the gate dielectric layer defines a second trench over the first trench, and the gate electrode is embedded in the second trench defined by the gate dielectric layer.

5. The semiconductor device of claim 4, wherein the second trench defined by the gate dielectric layer tapers in a direction toward the semiconductor substrate.

6. The semiconductor device of claim 1, wherein the gate dielectric layer comprises inner and outer sidewalls extending into the first trench, the inner sidewall abuts the gate electrode, and wherein the outer sidewall abuts the source and drain regions.

7. The semiconductor device of claim 1, wherein the gate electrode is partially raised above the semiconductor substrate.

8. The semiconductor device of claim 1, wherein the cap portion is outside the first trench.

9. The semiconductor device of claim 1, wherein the semiconductor substrate comprises a top surface, the first trench comprises a trench sidewall coinciding with the top surface, and wherein the gate dielectric layer conformally covers the top surface and the trench sidewall.

10. The semiconductor device of claim 1, wherein the semiconductor substrate comprises a top surface, the first trench comprises a trench sidewall coinciding with the top surface, and wherein one of the source and drain regions is present at a corner between the top surface and the trench sidewall.

11. The semiconductor device of claim 1, further comprising:
a memory device comprising a floating gate over the semiconductor substrate, wherein the floating gate and the gate electrode have substantially the same material.

12. The semiconductor device of claim 1, further comprising:
a memory device comprising a floating gate over the semiconductor substrate, wherein the floating gate has a top surface higher than a top surface of the gate electrode.

13. The semiconductor device of claim 1, further comprising:
a shallow trench isolation (STI) in the semiconductor substrate, wherein the shallow trench isolation has a bottom surface substantially level with a bottom surface with the gate dielectric layer.

14. A semiconductor device, comprising:
a semiconductor substrate;
a shallow trench isolation (STI) in the semiconductor substrate, the STI having a bottom surface substantially level with a bottom surface of a trench in the semiconductor substrate;
a dielectric trench liner lining sidewalls and the bottom surface of the trench in the semiconductor substrate;
a gate electrode over the dielectric trench liner and at least partially embedded in the trench in the semiconductor substrate; and
source and drain regions respectively adjacent to opposite sides of the trench.

15. The semiconductor device of claim 14, further comprising:
a memory device comprising a floating gate over the semiconductor substrate, wherein the floating gate has a top surface higher than that of the gate electrode.

16. The semiconductor device of claim 14, further comprising:
a memory device comprising a floating gate over the semiconductor substrate, wherein the floating gate has a bottom surface higher than that of the gate electrode.

17. The semiconductor device of claim 14, further comprising:
a memory device comprising a floating gate over the semiconductor substrate, wherein the gate electrode is made of a material of the floating gate.

18. A semiconductor device, comprising:
a semiconductor substrate;
a high-k dielectric layer on the semiconductor substrate;
a metal gate on the high-k dielectric layer;
a transistor comprising source/drain regions in the semiconductor substrate and a polysilicon gate embedded in the semiconductor substrate and in between the source/drain regions, wherein the polysilicon gate has a bottom surface lower than a bottom surface of the metal gate; and
a flash memory cell on the semiconductor substrate and comprising a floating gate, wherein the floating gate has a bottom surface higher than the bottom surface of the polysilicon gate and lower than the bottom surface of the bottom surface of the metal gate.

19. The semiconductor device of claim 18, wherein the polysilicon gate and the metal gate have different cross-sectional profiles.

20. The semiconductor device of claim 18, wherein the polysilicon gate has a top surface lower than a top surface of the floating gate of the flash memory cell.

* * * * *